(12) United States Patent
Tai

(10) Patent No.: US 10,488,468 B2
(45) Date of Patent: Nov. 26, 2019

(54) QUALITY-CONTROL-TESTING SYSTEM FOR PORTABLE CHARGING DEVICES AND METHODS OF USE

(71) Applicant: TwinTech Industry, Inc., Cerritos, CA (US)

(72) Inventor: Li-Te David Tai, Elk Grove Village, IL (US)

(73) Assignee: TwinTech Industry, Inc., Cerritos, CA (US)

( * ) Notice: Subject to any disclaimer, the term of this patent is extended or adjusted under 35 U.S.C. 154(b) by 0 days.

(21) Appl. No.: 15/552,471

(22) PCT Filed: Jan. 10, 2017

(86) PCT No.: PCT/US2017/012787
§ 371 (c)(1),
(2) Date: Aug. 21, 2017

(87) PCT Pub. No.: WO2017/123513
PCT Pub. Date: Jul. 20, 2017

(65) Prior Publication Data
US 2018/0045790 A1   Feb. 15, 2018

Related U.S. Application Data

(60) Provisional application No. 62/277,453, filed on Jan. 11, 2016.

(51) Int. Cl.
*G01R 31/40* (2014.01)
*H02J 7/00* (2006.01)

(52) U.S. Cl.
CPC ...... *G01R 31/40* (2013.01); *H02J 2007/0062* (2013.01)

(58) Field of Classification Search
CPC ...... G01R 31/40; G01R 31/045; G01R 31/04; G01R 31/026; G01R 31/041; G01R 31/025; H02J 2007/0062
(Continued)

(56) References Cited

U.S. PATENT DOCUMENTS 1,606,837 A * 11/1926 Horn ................. F16L 25/02
174/178
2,411,465 A * 11/1946 Richardson .......... B23K 28/02
219/75

(Continued)

OTHER PUBLICATIONS

International Search Report for PCT/US2017/012787, dated Apr. 18, 2017 (3 pages).
(Continued)

*Primary Examiner* — Christopher P McAndrew
(74) *Attorney, Agent, or Firm* — Terrence M. Wyles, Esq.; Startup IP Law, LLC

(57) ABSTRACT

The inventive disclosure disclosed herein is generally directed to an improved portable-charger testing system (CT System) is an automated test system designed to screen-out defective units in a high-volume manufacturing process, and is specifically utilized for high-power devices such as portable chargers, powerbanks, wall chargers, car chargers, and associated cables. In typical embodiments, the CT System is comprised of measuring instruments and connection relays that work in concert to verify the functionalities of a device under test. The test instruments and relays are controlled by executing specialized software that facilitates communication between the various components through a Universal Serial Bus (USB) medium. Moreover, in many embodiments, the improved system securitizes, processes, and uploads the test data to a central Internet-based server for remote retrieval and post-processing.

48 Claims, 16 Drawing Sheets

FIG. 1A

(58) Field of Classification Search
USPC .......................................................... 324/538
See application file for complete search history.

(56) References Cited

U.S. PATENT DOCUMENTS

| | | | | |
|---|---|---|---|---|
| 2,706,496 A * | 4/1955 | Bond | ........................ | F16L 3/18 |
| | | | | 138/113 |
| 4,449,853 A * | 5/1984 | Mennella | .................. | F16L 5/10 |
| | | | | 138/114 |
| 5,088,773 A * | 2/1992 | Gralenski | ............. | F16L 25/023 |
| | | | | 285/325 |
| 5,623,610 A * | 4/1997 | Knoll | .................. | G06F 12/0661 |
| | | | | 710/105 |
| 5,694,555 A * | 12/1997 | Morriss | ................. | G06F 13/385 |
| | | | | 710/100 |
| 6,829,726 B1 * | 12/2004 | Korhonen | ............. | G06F 11/273 |
| | | | | 710/5 |
| 6,833,636 B1 | 12/2004 | Nestel et al. | | |
| 7,821,763 B2 * | 10/2010 | Goodson | ................. | F16L 25/01 |
| | | | | 361/215 |
| 8,399,767 B2 * | 3/2013 | Duquette | ................ | F16L 9/147 |
| | | | | 174/84 R |
| 2006/0080536 A1 * | 4/2006 | Teppler | ..................... | H04L 9/12 |
| | | | | 713/176 |
| 2007/0131302 A1 * | 6/2007 | Relats | ..................... | F16L 11/02 |
| | | | | 139/83 |
| 2007/0192216 A1 * | 8/2007 | Arnold | ................... | G06Q 10/08 |
| | | | | 705/28 |
| 2012/0005393 A1 * | 1/2012 | Hu | .................... | H04L 12/40006 |
| | | | | 710/313 |
| 2013/0049794 A1 * | 2/2013 | Humphrey | ............. | G01R 31/40 |
| | | | | 324/764.01 |
| 2013/0059453 A1 | 3/2013 | Tseng | | |
| 2013/0241584 A1 | 9/2013 | Mao et al. | | |
| 2015/0146962 A1 * | 5/2015 | Roberts | ................. | B07C 5/3422 |
| | | | | 382/133 |

OTHER PUBLICATIONS

Written Opinion of the International Searching Authority for PCT/US2017/012787, dated Apr. 18, 2017 (8 pages).

* cited by examiner

Test Parameters

Portable Charger

|  | Port 1 | Port 2 |  |
|---|---|---|---|
| Input Voltage Set To: | 5 |  | V |
| Charger Turn-On Delay = | 250 |  | ms |
| ☐ Unloaded Voltage = | 4.6 | 4.6 | V |
| Charger Load Delay = | 100 |  | ms |
| ☑ Rated Current Set To: | 0.8 | 0.8 | A |
| Loaded Voltage = | 4.6 | 4.6 | V |
| Rated Discharge Cur = | 0.8 | 2.1 | A |

☑ Enable Short Circuit Test
Short Circuit Duration = 200 ms

☑ Enable Reactivation Test
Reactivate Duration = 500 ms

Supply Charge Delay = 200 ms

|  | UL | LL | UL | LL |  |
|---|---|---|---|---|---|
| ☐ Charge Cur = | 0.9 | 0.1 | 0.9 | 0.1 | A |

|  |  | UL | LL | UL | LL |  |
|---|---|---|---|---|---|---|
| D Test Options | Short - 短路 ▼ | 0.2 | -0.2 | 0.2 | -0.2 |  |
| Loaded Cable Loss |  | 0.15 |  | 0.15 |  | Ω |
| Supply Cable Loss = |  | 0.15 |  | 0.15 |  | Ω |

FIG. 5B-1

QUALITY-CONTROL-TESTING SYSTEM FOR PORTABLE CHARGING DEVICES AND METHODS OF USE

CROSS-REFERENCE TO RELATED APPLICATIONS

This patent application claims the priority benefit of U.S. Provisional Patent Application No. 62/277,453, filed on Jan. 11, 2016 for "Improved Quality-Control-Testing System for Portable Powerbanks and Methods of Use". In addition, this patent application hereby incorporates by reference U.S. Provisional Patent Application No. 62/277,453 for all purposes. If there are any irreconcilable conflicts between this patent application and the disclosure of U.S. Provisional Patent Application No. 62/277,453, then this patent application's teachings shall govern.

BACKGROUND

Portable power supplies; that is, powerbanks and/or chargers for portable electronic devices, are ubiquitous, and there remains an ever-growing demand for more and/or improved devices. As manufacturers continue to try and meet this growing demand, existing quality-control processes to ensure that such devices meet all required specifications have proven to be inefficient and often unreliable, especially when large quantities of such devices are being mass-produced. What is needed is an improved charger-testing system to provide a cost-effective and reliable testing environment that both significantly increases production capabilities and provides a convenient and auditable reporting functionality that gives manufacturers and their customers confidence in the manufacturing and quality-control process for such portable power supplies.

BRIEF SUMMARY

The improved portable-charger-testing system (CT System) is an automated test system designed to screen-out defective units in a high-volume manufacturing process, and is specifically utilized for high-power devices such as portable chargers, powerbanks, wall-based chargers, automobile-based chargers, and associated cables. In typical embodiments, the CT System is comprised of one or more measuring instruments and connection relays that work in concert to verify the functionalities of a device under test. The test instruments and relays are controlled by executing specialized software that facilitates communication between the various components through a Universal Serial Bus (USB) medium. Moreover, in many embodiments, the improved system securitizes, processes, and uploads the test data to a central Internet-based server for remote retrieval and post-processing.

The foregoing Brief Summary is intended to merely provide a short, general overview of the inventive disclosure described throughout this patent application, and therefore, is not intended to limit the scope of the inventive disclosure contained throughout the balance of this patent application, including any appended claims and drawings.

BRIEF DESCRIPTION OF THE DRAWINGS

FIGS. 1B-1D include photo depictions of some of the components in the wiring diagram.

FIG. 5B-1 depicts one alternative embodiment of a portion of a test-parameters configuration page for the CT System 1 software interface, as compared to FIG. 5B. In this alternative embodiment, a "dynamic test flow" feature has been added to test-configuration screen. It shows how the test flow order and setting highlights change when various test functions are enabled or disabled. In the instant example in FIG. 5B-1, "Enable Short Circuit Test" and "Enable Reactivation Test" are shown as enabled. Such dynamic viewing allows the CT System 1 operator to intuitively optimize critical timing and threshold setting for stability, accuracy, and speed based on the actual test flow embedded in software that would otherwise not be easily discernable.

DETAILED DESCRIPTION

I. Overview

Figure 1A:
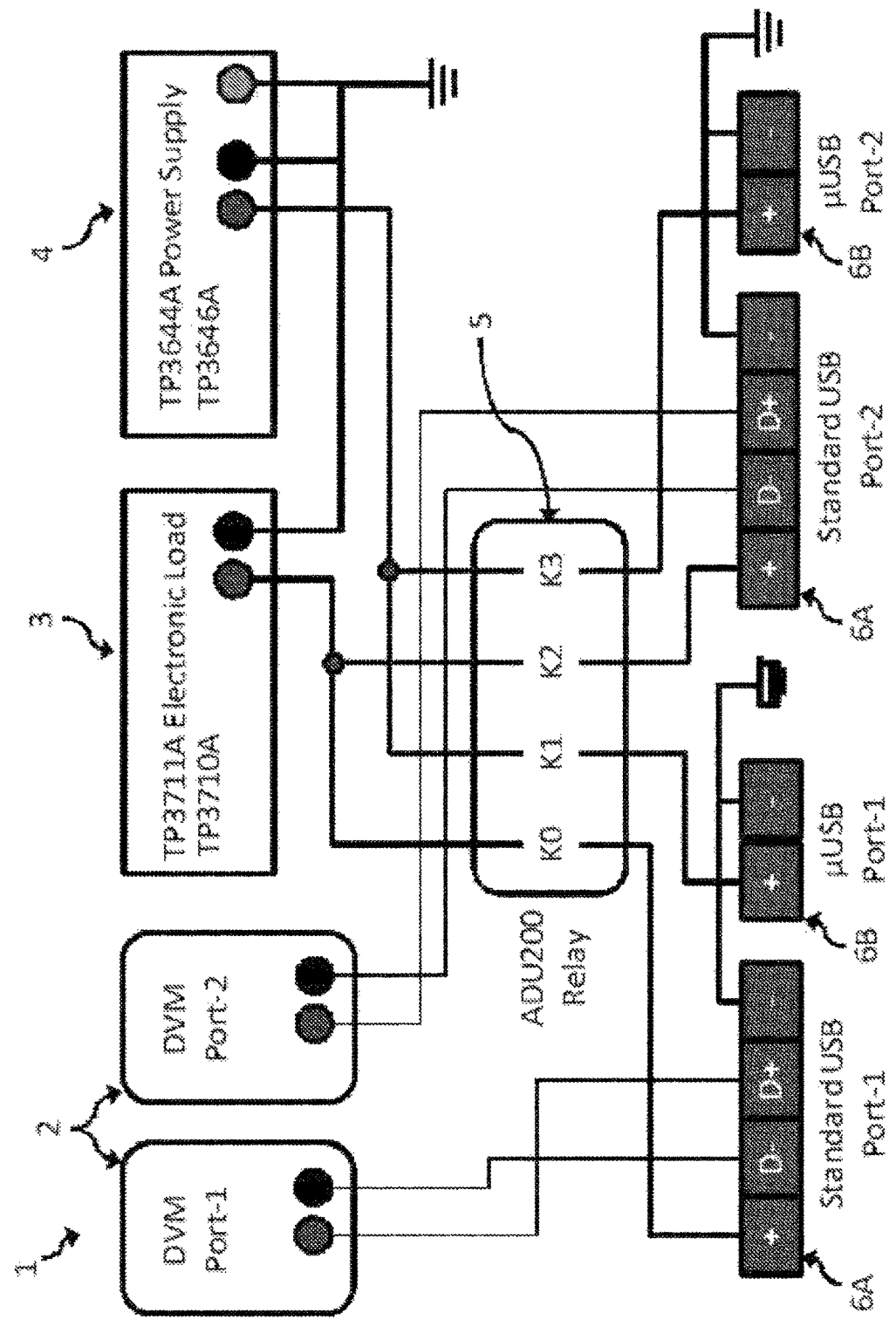
FIGS. 1A-1D depicts one embodiment of a simplified wiring diagram an CT System 1 for portable charging devices, the CT System 1 configured to support the simultaneous/alternating testing of two portable charging devices in order to minimize the idle down time of the testing system in order to maximize the number of devices to be subjected to quality-control processes. The CT System 1 features four USB ports 6A, 6B, two of which are standard USB ports 6A and two of which are micro USB ports 6B; two digital voltage meters (DVMs) 2, each configured to monitor the differential-data signals at the D+ and D− USB pins in the standard USB ports 6A; an electronic test load 3; a test power supply 4; and a relay-test unit 5; for example, an ADU200 USB 4-Channel Relay I/O Interface available from Ontrak Control Systems.

The improved portable-charger-testing system (CT System) is an automated test system designed to screen-out defective units in a high-volume manufacturing process, and is specifically utilized for high-power devices such as portable chargers, powerbanks, wall-based chargers, automobile-based chargers, and associated cables. In typical embodiments, the CT System is comprised of one or more measuring instruments and connection relays that work in concert to verify the functionalities of a device under test. The test instruments and relays are controlled by executing specialized software that facilitates communication between the various components through a Universal Serial Bus (USB) medium. Moreover, in many embodiments, the improved system securitizes, processes, and uploads the test data to a central Internet-based server for remote retrieval and post-processing.

II. Terminology

The terms and phrases as indicated in quotes (" ") in this Section are intended to have the meaning ascribed to them in this Terminology Section applied to them throughout this document, including the claims, unless clearly indicated otherwise in context. Further, as applicable, the stated definitions are to apply, regardless of the word or phrase's case, to the singular and plural variations of the defined word or phrase.

The term "or", as used in this specification, drawings, and any appended claims, is not meant to be exclusive; rather, the term is inclusive, meaning "either or both".

References in the specification to "one embodiment", "an embodiment", "a preferred embodiment", "an alternative embodiment", "a variation", "one variation", and similar phrases mean that a particular feature, structure, or characteristic described in connection with the embodiment is included in at least an embodiment of the invention. The appearances of the phrase "in one embodiment", "in one variation", and/or similar phrases in various places in the specification are not necessarily all meant to refer to the same embodiment.

The term "couple" or "coupled", as used in this specification, drawings, and any appended claims, refers to either an indirect or a direct connection between the identified elements, components, or objects. Often the manner of the coupling will be related specifically to the manner in which the two coupled elements interact.

The term "removable", "removably coupled", "readily removable", "readily detachable", "detachably coupled", and similar terms, as used in this specification, drawings, and any appended claims, refer to structures that can be uncoupled from an adjoining structure with relative ease (i.e., non-destructively and without a complicated or time-consuming process) and that can also be readily reattached or coupled to the previously adjoining structure.

Directional and/or relational terms such as, but not limited to, left, right, nadir, apex, top, bottom, vertical, horizontal, back, front, lateral, proximal, and distal are relative to each other, are dependent on the specific orientation of an applicable element or article, are used accordingly to aid in the description of the various embodiments, and are not necessarily intended to be construed as limiting in this specification, drawings, and any appended claims.

As applicable, the terms "about" or "generally", as used herein unless otherwise indicated, means a margin of +−20%. Also, as applicable, the term "substantially" as used herein unless otherwise indicated means a margin of +−10%. It is to be appreciated that not all uses of the above terms are quantifiable such that the referenced ranges can be applied.

The terms "powerbank", "portable charging device", "charger", as well as similar terms, as used in this specification, drawings, and any appended claims, refers to any type of portable electrical-energy-storage device that can be used to recharge and/or power portable electronic devices, such as smartphones, tablet computing devices, gaming devices, music-playing devices (e.g., mp3 players), and many other mobile electronic devices. Typically, such a device comprises an internal battery (e.g., a lithium-ion battery), onboard circuitry to manage the charge state, and access ports for charging-cable connections (e.g., USB connectors). Other similar terms used in the art that can be considered analogous to the term "powerbank" include "battery pack", "juice pack", Mophie®, "portable phone charger", "portable external battery charger", "portable backup battery", and many more.

III. An Improved Quality-Control-Testing System for Portable Charging Devices and Related Equipment This Section III is directed to an improved and automated quality-control-testing system for use with portable charging devices produced in mass quantities, such as, but not limited to, powerbanks.

General Physical Configuration Details

Refer to FIGS. 1A-1D, 2-3, 4A-4J, and 5A-5E. In various embodiments, the improved portable-charger-testing system 1 (CT System) is an automated test system designed to screen-out defective units in a high-volume manufacturing process, and is specifically utilized for high-power devices such as portable chargers, wall chargers, car chargers, and associated cables. In a typical embodiment, the CT System 1 is comprised of one or more measuring instruments (e.g., digital voltmeters [DVM]) 2, a power supply 4 (such as, for example, a Tekpower TP3644A or TP3646A programmable and variable high-precision DC power supply, each rated at 0-18 VDC and 0-5 ADC or 0-72 VDC and 0-1.5 ADC, respectively), an artificial test load 3 (such as, for example, a Tekpower TP3711A or TP3710A programmable DC electronic load, each rated at 300 W or 150 W, respectively, or Maynuo M971X series DC electronic loads), and connection relays 5, 5A, 5B that work in concert to verify the functionalities of a device under test (DUT). The test instruments 2 and relays 5, 5A, 5B are controlled by executing specialized software that facilitates communication between the various components through a Universal Serial Bus (USB) medium.

Moreover, in many embodiments, the improved CT System 1 securitizes, processes, and uploads the test data to a central Internet-based server for remote retrieval and post-processing (see, e.g., FIGS. 4B-4J). In support of communications with remote servers, the Internet, etc., as well as to provide a user interface and display screen, the CT System 1 necessarily incorporates at least one computing device that in communication with the measuring instrumentation 2, the artificial test load, the power supply, and all connection relays. Such a supporting computing device typically is equipped with local data-storage capabilities, a graphical display, a user-input device (such as a keyboard and/or mouse), and at least one communications means to transmit data to and from at least one remotely located server via an intranet and/or the Internet. Moreover, in embodiments, the CT System 1 computing device can be a stand-alone computing device, such as a desktop or laptop computer, or it can be a customized device specific to this application and even integrated into the hardware components of the CT System 1.

Figure 5A:
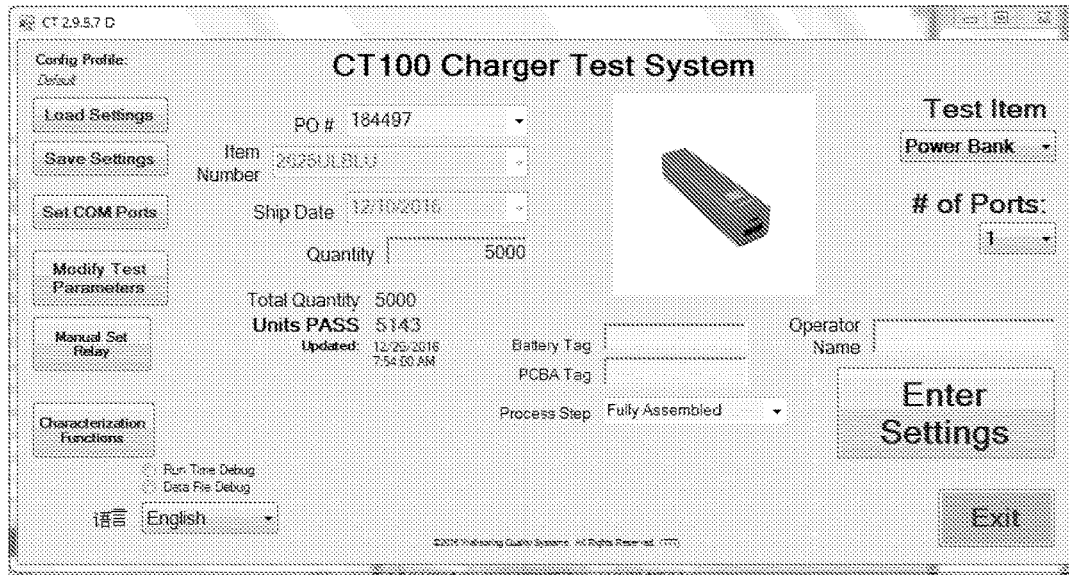
FIG. 5A depicts one embodiment of the CT System 1 control software interface, specifically the portal that connects a system user into the functions for managing test parameters. It also takes the description data that is relevant to the test run that will be used as identifiers for data files.

In many embodiments, the CT System 1 employs various user-interface display screens to facilitate user input and/or user-prescribed system settings. FIGS. 5A-5E provide example screenshots toward this end, and are described as follows:

FIG. 5A depicts one embodiment of the CT System 1 control software interface, specifically the portal that connects a system user into the functions for managing test parameters. It also takes the description data that is relevant to the test run that will be used as identifiers for data files.

Figure 5B:
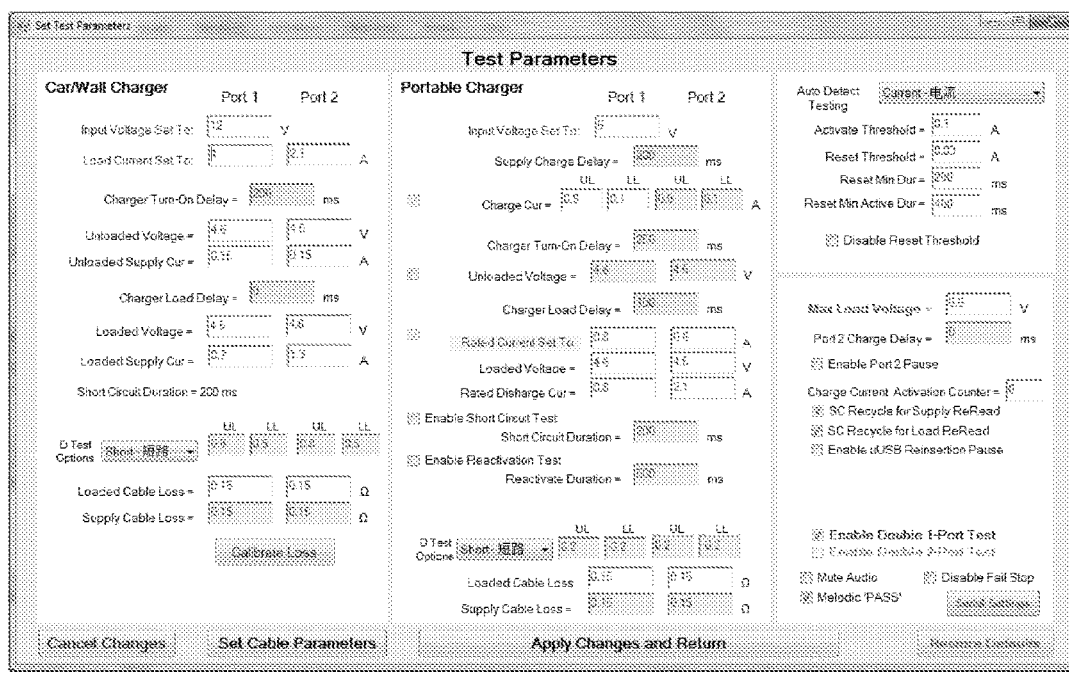
FIG. 5B depicts one embodiment of a test-parameters configuration page for the CT System 1 software interface. This interface allows a user to set pass/fail limits and configure control factors that affects instrumentation settings, detection level for test run activation, and time delays to compensate for instrument or DUT settling dynamics.

FIG. 5B depicts one embodiment of a test-parameters configuration page for the CT System 1 software interface. This interface allows a user to set pass/fail limits and configure control factors that affects instrumentation settings, detection level for test run activation, and time delays to compensate for instrument or DUT settling dynamics.

FIG. 5B-1 depicts one alternative embodiment of a portion of a test-parameters configuration page for the CT System 1 software interface, as compared to FIG. 5B. In this alternative embodiment, a "dynamic test flow" feature has been added to test-configuration screen. It shows how the test flow order and setting highlights change when various test functions are enabled or disabled. In the instant example in FIG. 5B-1, "Enable Short Circuit Test" and "Enable Reactivation Test" are shown as enabled. Such dynamic viewing allows the CT System 1 operator to intuitively optimize critical timing and threshold setting for stability, accuracy, and speed based on the actual test flow embedded in software that would otherwise not be easily discernable.

Figure 5C:
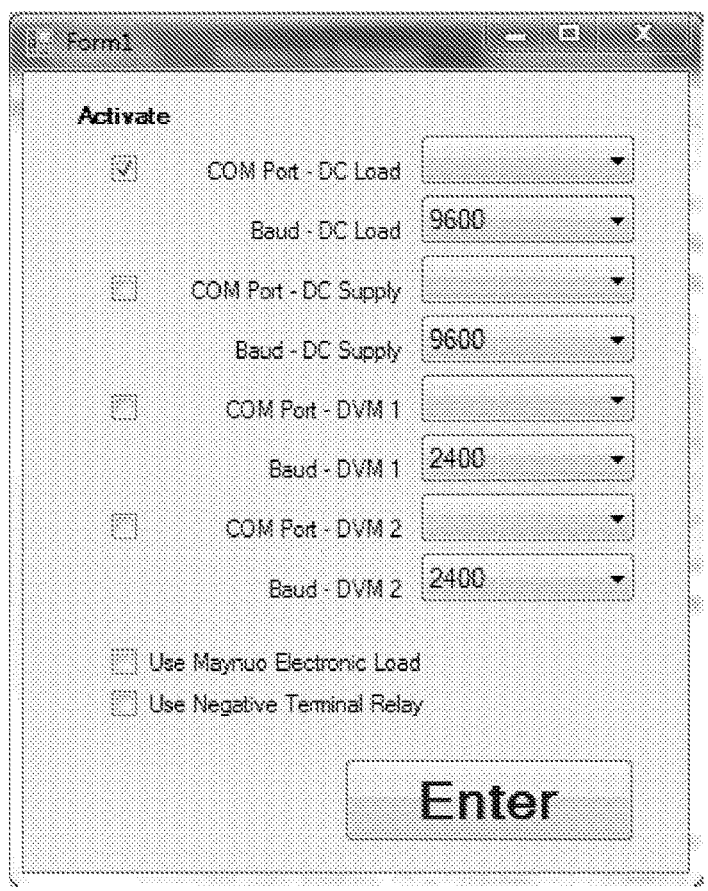
FIG. 5C depicts one embodiment of the CT System 1 user interface used to configure and activate the communications-port (COMPORT) assignments for the various instruments used in the CT System 1. This interface also provides the option to use a relay for the negative return path so that disconnections in the negative return path can be detected.

FIG. 5C depicts one embodiment of the CT System 1 user interface used to configure and activate the communications-port (COMPORT) assignments for the various instruments used in the CT System 1. This interface also provides the option to use a relay for the negative return path so that disconnections in the negative return path can be detected.

Figure 5D:
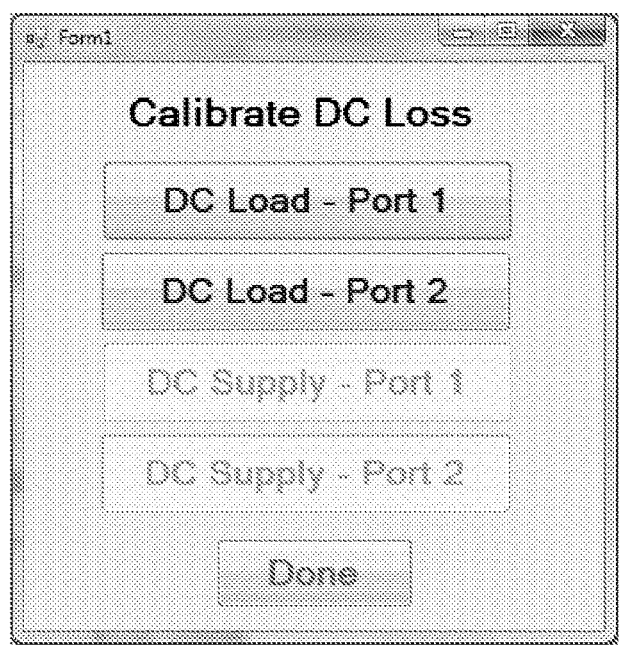
FIG. 5D depicts one embodiment of a control page of the CT System 1 that sets the system relays for measuring DC loss associated with the cabling mechanisms of each port. This loss is used to calibrate the voltage offset for the DC supply and load instruments.

FIG. 5D depicts one embodiment of a control page of the CT System 1 that sets the system relays for measuring DC loss associated with the cabling mechanisms of each port. This loss is used to calibrate the voltage offset for the DC supply and load instruments.

Figure 5E:
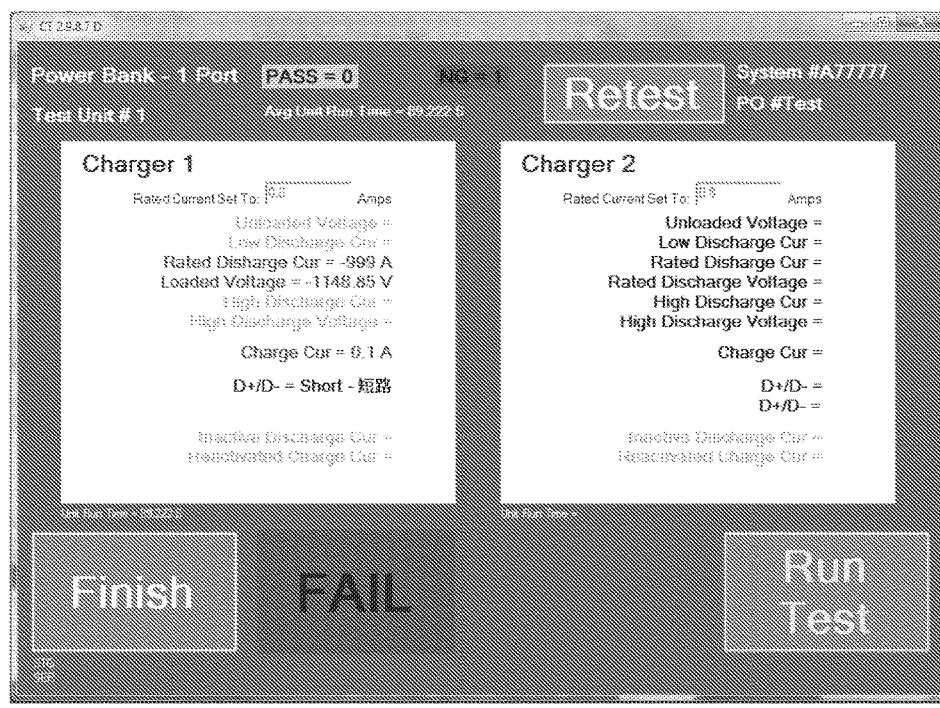
FIG. 5E depicts one embodiment of a test-run-execution user interface for the CT System 1. The test run for each DUT can be initiated automatically by a detection of a voltage at the load or current draw at the supply. It can also be initiated by hitting the "Run Test" button. A user can also "Retest" any DUT for indefinite number of times. A test outcome indicator ("PASS" or "FAIL") plus optional audio alert will manifest to indicate the state of the test outcome.

FIG. 5E depicts one embodiment of a test-run-execution user interface for the CT System 1. The test run for each DUT can be initiated automatically by a detection of a voltage at the load or current draw at the supply. It can also be initiated by hitting the "Run Test" button. A user can also "Retest" any DUT for indefinite number of times. A test outcome indicator ("PASS" or "FAIL") plus optional audio alert will manifest to indicate the state of the test outcome.

Figure 1B:
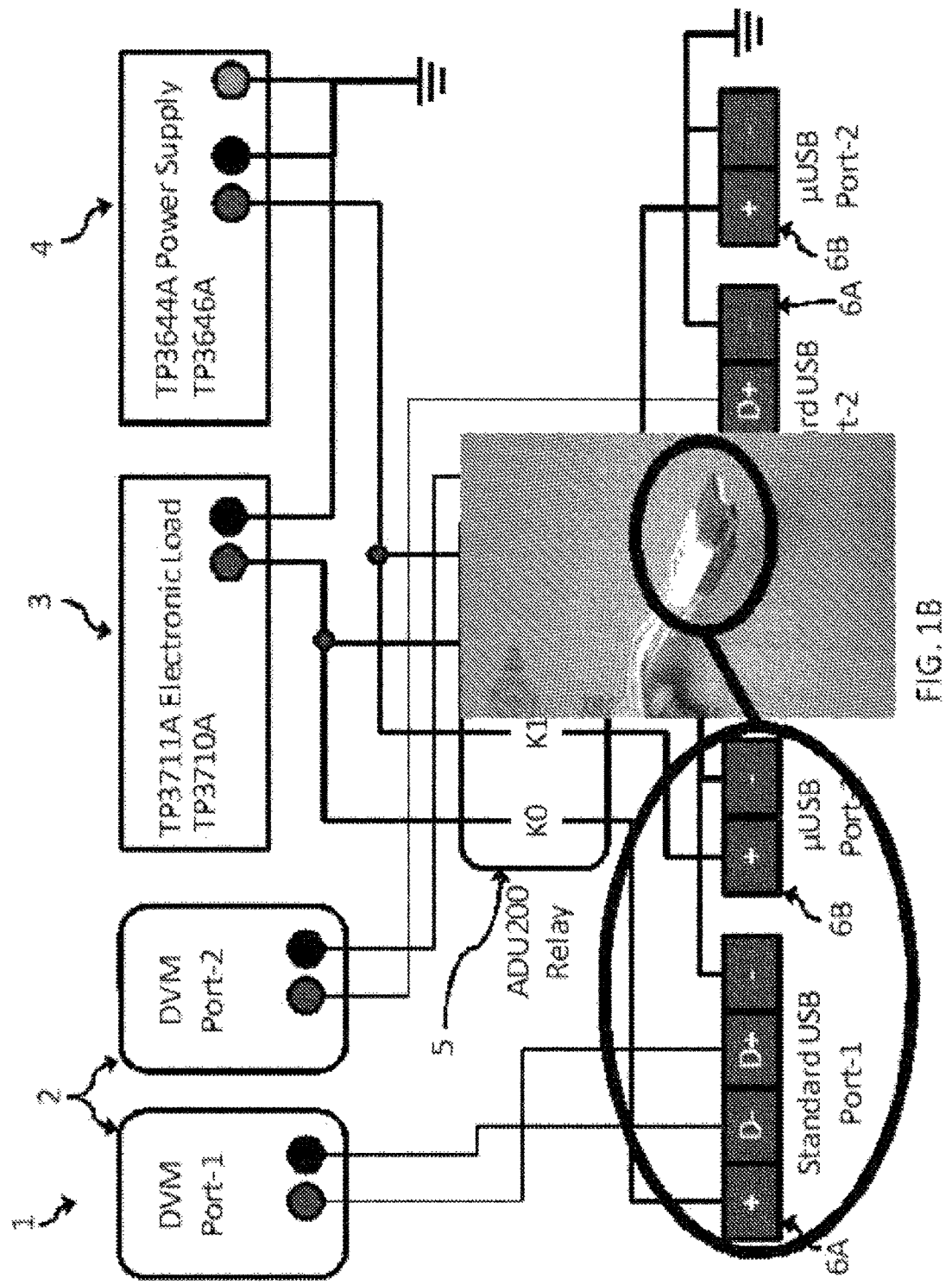
Figure 1C:
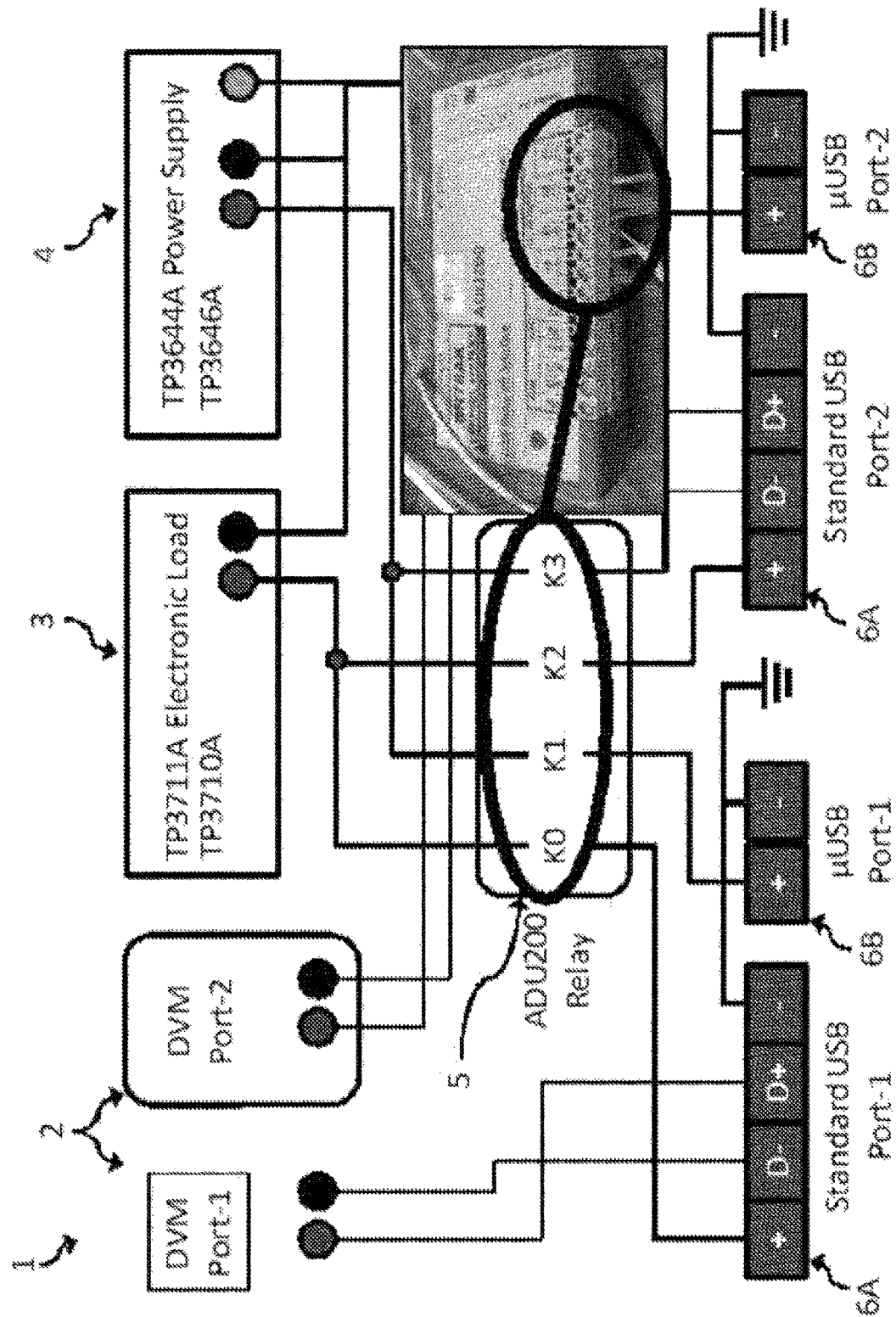
Figure 1D:
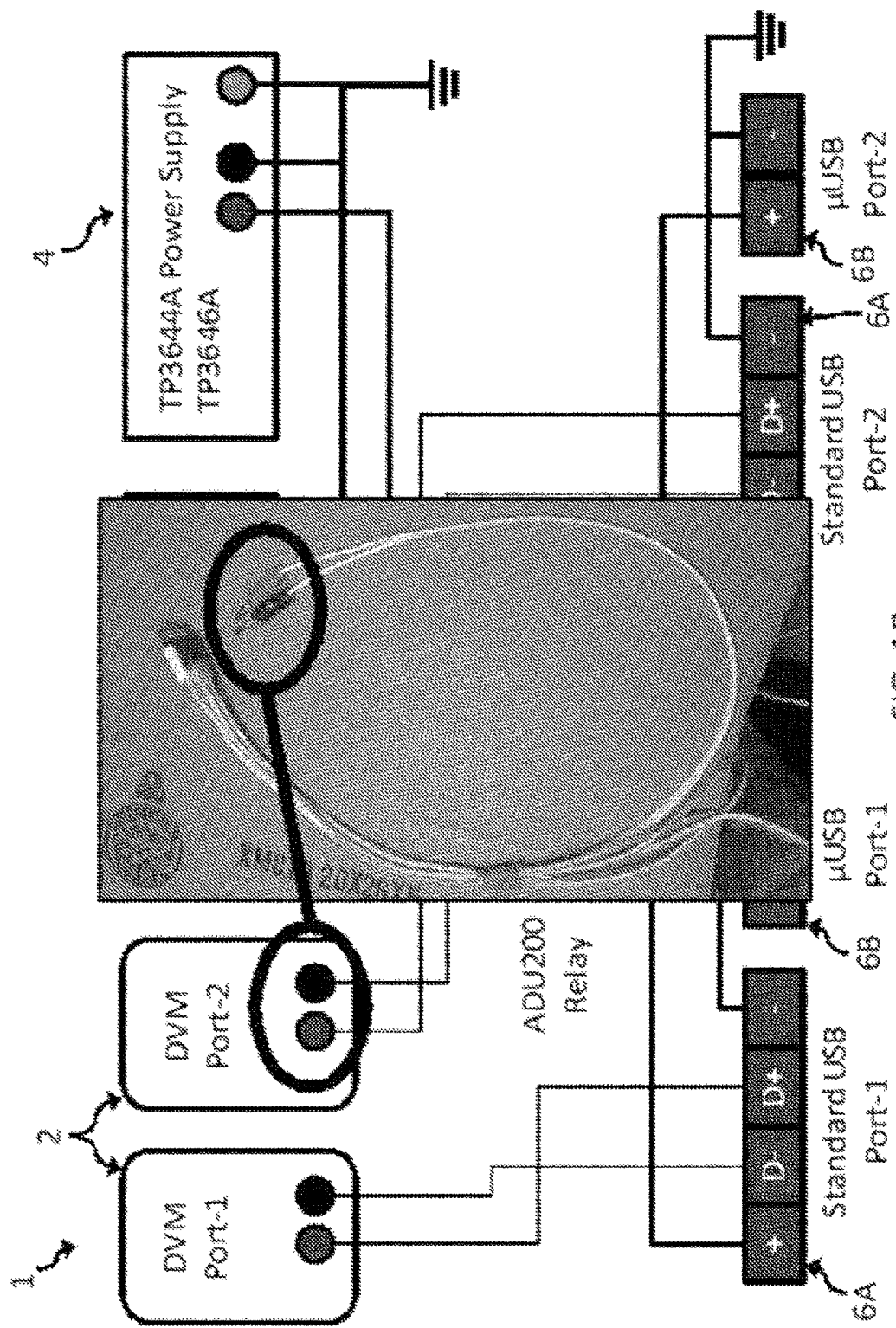

In an embodiment of a simplified wiring diagram an CT System 1 for portable charging devices, depicted in FIGS. 1A-1D, the CT System 1 is configured to support the simultaneous/alternating testing of two portable charging devices in order to minimize the idle down time of the testing system in order to maximize the number of devices to be subjected to quality-control processes. The CT System 1 features four USB ports 6A, 6B, two of which are standard USB ports 6A and two of which are micro USB ports 6B; two digital voltmeters (DVMs) 2, each configured to monitor the differential-data signals at the D+ and D− USB pins in the standard USB ports 6A; an electronic test load 3; a test power supply 4; and a relay-test unit 5; for example, an ADU200 USB 4-Channel Relay I/O Interface available from Ontrak Control Systems. FIGS. 1B-1D include actual photo depictions of some of the components in the wiring diagram.

Figure 2:
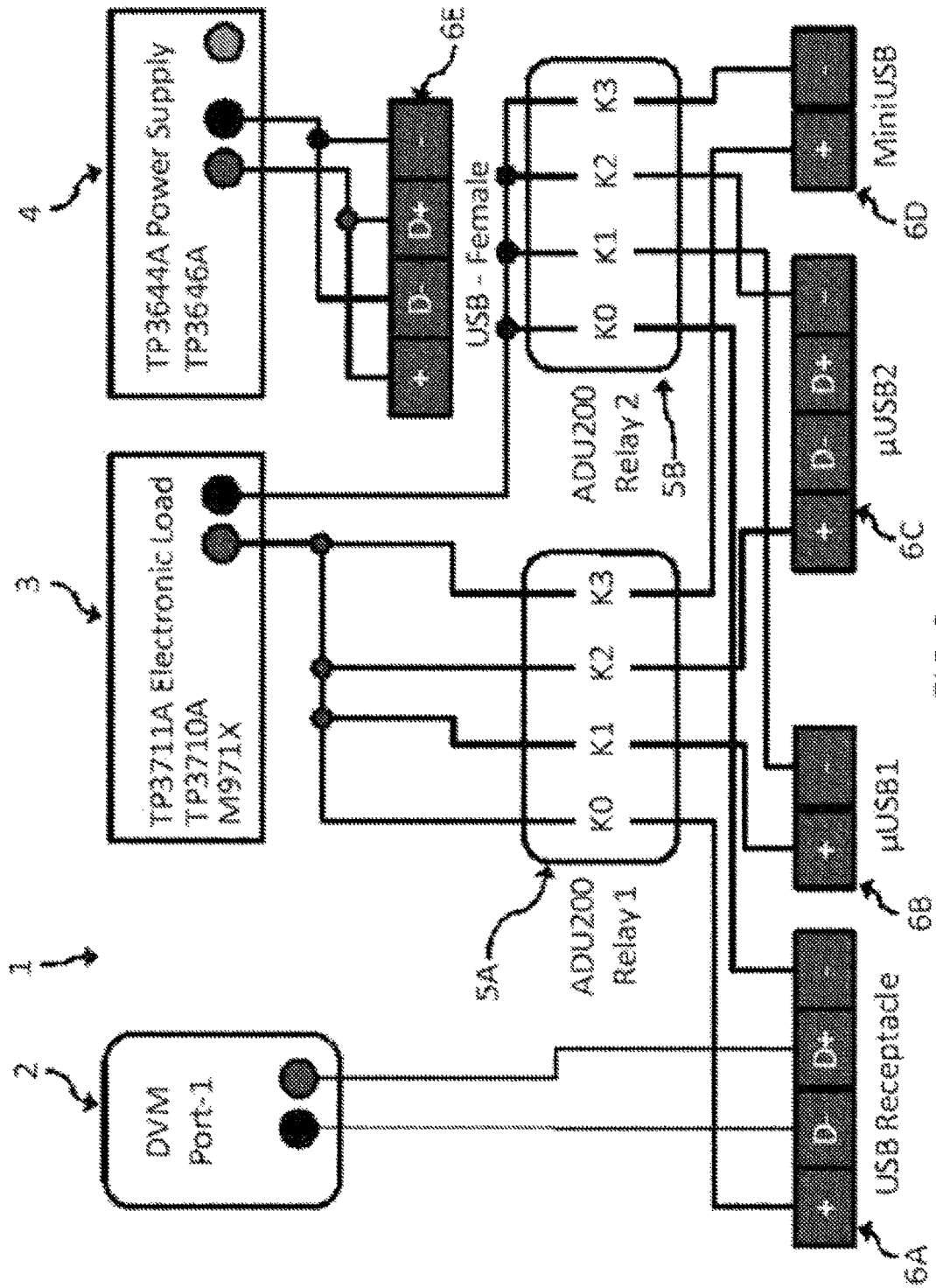
FIG. 2 depicts one alternate embodiment of a simplified wiring diagram an CT System 1 for portable charging cables, specifically such that the CT System 1 can be used with a four-port USB cable with a standard USB connector on one end and four USB connectors of various sizes and types on the other end. The CT System 1 features four USB ports 6A, 6B, 6C, 6D, each adapted to receive one of the four ports of said cable, and a fifth USB port 6E that is in electrical communication with a test power supply 4 and is adapted to receive the opposite end of the cable. The CT System 1 further features a digital voltage meter (DVM) 2 configured to monitor the differential-data signals at the D+ and D− USB pins in the standard USB port 6A; an electronic test load 3 in electrical communication (via the positive bus) with a first relay-test unit 5; for example, an ADU200 USB 4-Channel Relay I/O Interface available from Ontrak Control Systems. A second relay-test unit 5 is also electrical communication with said electronic test load 3 (via the ground bus), which helps isolate and detect faults specifically associated with the ground bus.

In one alternate embodiment of a simplified wiring diagram an CT System 1 for the testing of portable charging cables, depicted in FIG. 2, the CT System 1 uses a four-port USB cable with a standard USB connector on one end and a plurality of USB connectors of various sizes and types on the other end. The CT System 1 itself features a plurality of USB ports 6A, 6B, 6C, 6D (in this case four ports, though one ordinarily skilled in the art will appreciate that the number of ports can vary in variations involving the testing of cables with other numbers of USB connectors), each adapted to receive one of the four ports of said cable, and a fifth USB port 6E that is in electrical communication with a test power supply 4 and is adapted to receive the opposite end of the cable. The CT System 1 further features a digital voltage meter (DVM) 2 configured to monitor the differential-data signals at the D+ and D− USB pins in the standard USB port 6A; an electronic test load 3 in electrical communication (via the positive bus) with a first relay-test unit 5; for example, an ADU200 USB 4-Channel Relay I/O Interface available from Ontrak Control Systems. A second relay-test unit 5 is also electrical communication with said electronic test load 3 (via the ground bus), which helps isolate and detect faults specifically associated with the ground bus.

Figure 3:
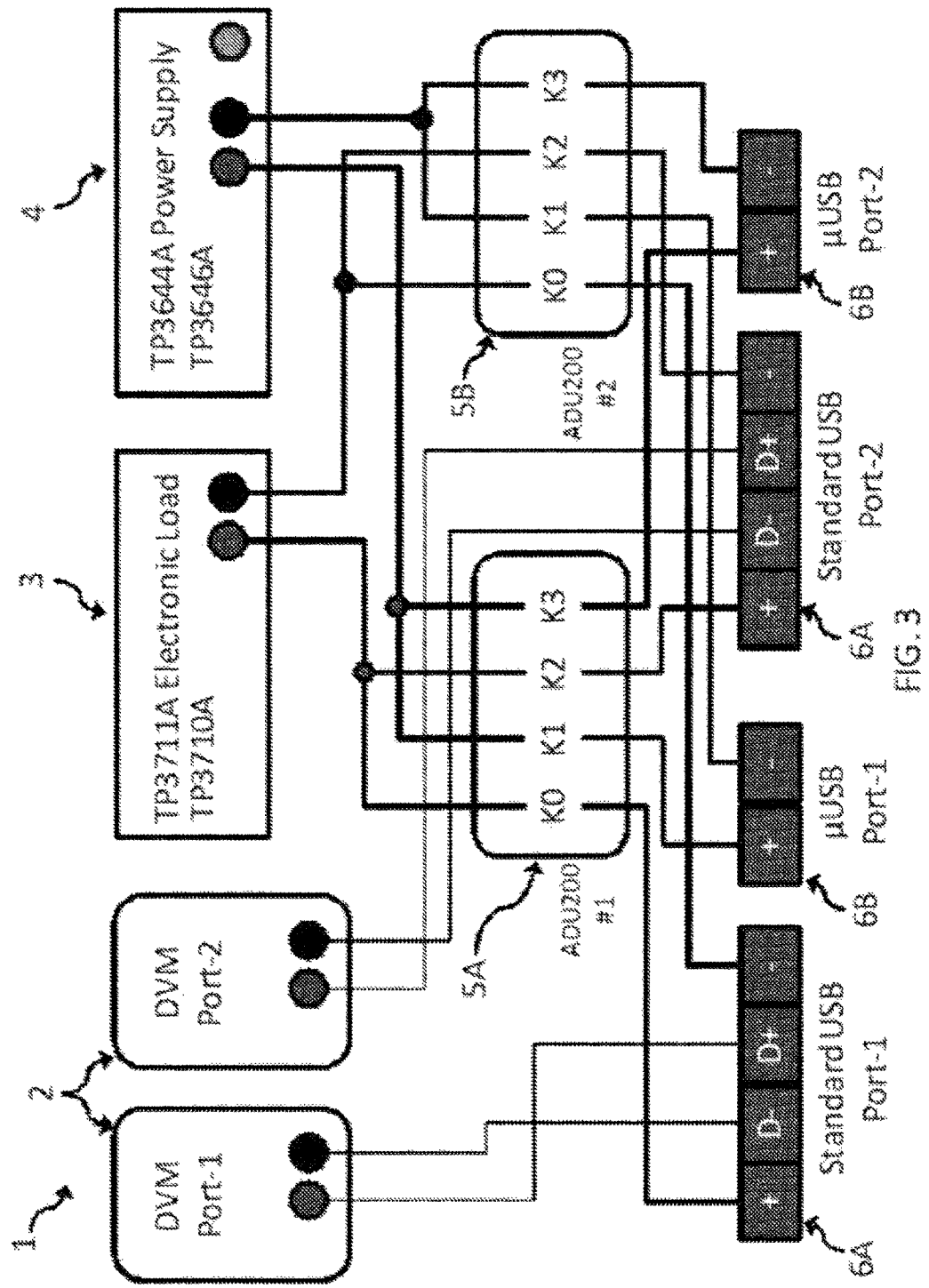
FIG. 3 depicts another alternate embodiment of a simplified wiring diagram an CT System 1 for portable charging devices as depicted in FIGS. 1A-1D; however, in this embodiment, a second relay-test unit 5 is also electrical communication with said electronic test load 3 (via the ground bus), which helps isolate and detect faults specifically associated with the ground bus.

In yet another alternate embodiment of a simplified wiring diagram an CT System 1 for portable charging devices, as depicted in FIG. 3; the CT System 1 further comprises a second relay-test unit 5A, 5B is also electrical communication with said electronic test load 3 (via the ground bus), which helps isolate and detect faults specifically associated with the ground bus. For some testing configurations, the CT System 1 utilizes separate relays 5A, 5B dedicated for connecting the DUT to only the positive or negative terminals of the measuring instrument. See FIGS. 1C-1D.

In an embodiment, the test cables splices off the D+/D− signals from the USB connector (see FIG. 1D) and allows for an independent connection to another extra-system measuring instrument 2 (e.g., digital multi-meter [DMM]) using a test cable. The software maximizes this independence by running the test process that utilizes the DMM 2 in parallel with the rest of the instrument 2.

In many embodiments, the improved CT System's 1 software includes a plurality of unique identifiers embedded in the hardware of every CT System 1, and the embedded software program can: (a) Configure user rights for accessing various levels of detail in the test report; (b) Configure available test functionalities and their active date range in the improved CT System 1 environment; (c) Retrieve specific data files in the improved CT System 1 storage media in the event that the data file was not successfully uploaded to the Internet-based server; and (d) Send custom messages that appear when the software program is launched. In variations, if the improved CT System 1 does not have a registered identifier, then it will default to a demonstration mode that allows for limited operation. In other variations, the CT System 1 securely uploads encrypted test data to an Internet-based server that allows for near-instant verification of product performance and improve CT System 1 performance. This near-instant access also allows for the automatic generation of customer-friendly test reports that can be sent even before their purchase order is shipped.

Specialized Control-System Configuration Details

In many embodiments, the improved CT System 1 includes control-software provisions functions that takes advantage of the time gap needed for the test operator to set up the devices for each functional test run. This results in a back-to-back continuous utilization of the test system 1 without any idle down time. It also enables multiple test ports to use a single set of test instruments 2. The improved CT System 1 is designed to allow testing via any of the parallel USB ports 6A, 6B, 6C, 6D while the operator/user removes the previously tested device and sets up the next device for test. See, e.g., FIG. 4A.

For example, in some variations, a relay mechanism 5, 5A, 5B connects two or more identical test ports 6A, 6B, 6C, 6D to a common set of test instruments. While a first test port 6A, 6B, 6C, 6D performs its test 10C on a "device under test" (DUT), the operator can remove another DUT from a second test port 6A, 6B, 6C, 6D that has already completed its test and set up 10A a new, untested DUT. The improved CT System 1 can be configured to automatically start test 10C on the second test port 6A, 6B, 6C, 6D when the first test port 6A, 6B, 6C, 6D test 10C is completed. This process can propagate through the available test ports 6A, 6B, 6C, 6D and eventually repeat itself in a repeated circuitous manner.

Figure 4A:
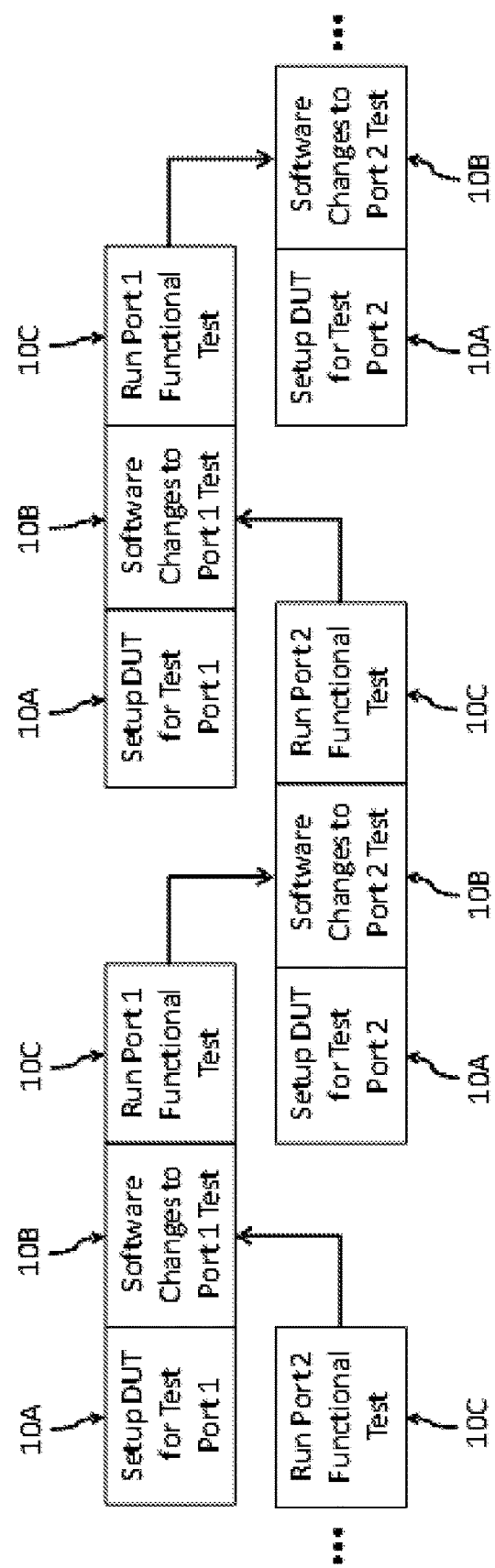
FIG. 4A depicts one embodiment of a timing diagram for the testing of two portable charging devices under test ("devices under test" [DUT]), which allows an embodiment of an CT System 1 for portable charging devices to maximize the quality-control processing of portable charging devices being produced in mass quantities.
Figure 4B:
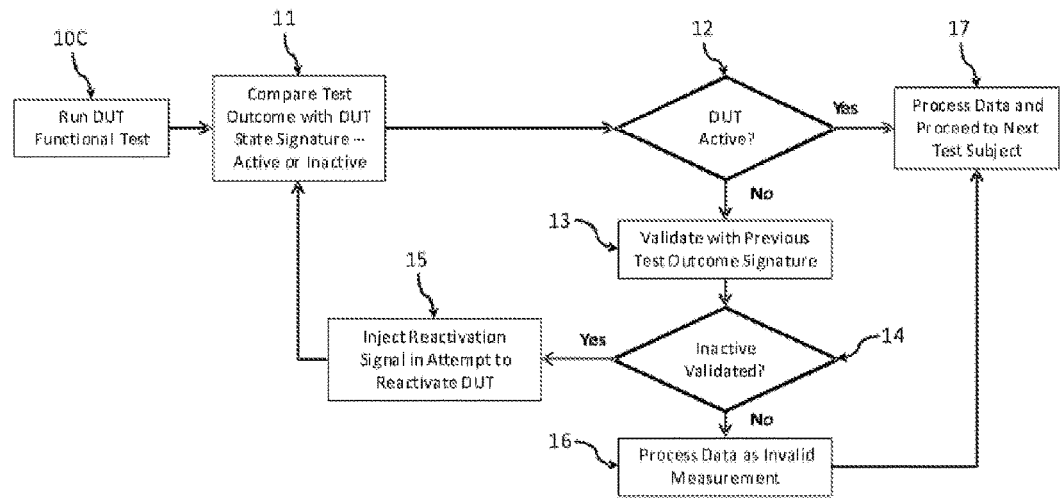
FIG. 4B depicts one embodiment of a control process for the CT System 1 to detect whether a DUT is in an inactive state by functional measurement. If an inactive state is detected, the system will signal a power supply to inject an activation signal to awaken the DUT into an active state, thus allowing the DUT to continue its test run without operator intervention.

In variations, for a multi-port DUT that requires multiple test ports 6A, 6B, 6C, 6D, the improved CT System's 1 software program allows for the operator to initiate the test process of one port 6A, 6B, 6C, 6D, while suspending the test process of the next port 6A, 6B, 6C, 6D until the previous test is finished and the next port test 6A, 6B, 6C, 6D is set up. This avoids the CT System 1 down time for test port 6A, 6B, 6C, 6D set up for a multi-port DUT and enables the CT System 1 to run in a continuous manner. In variations, the software program for the improved CT System 1 allows for user-configurable time delays 10B for charge-up measurements that are basic part of portable-charger functional testing. Referring to FIG. 4B, in some embodiments, the CT System 1 software enables the improved CT System 1 to perform the following steps:

After running a DUT functional test, detecting 11, 12 whether a DUT is in an inactive state by functional measurement;

If the DUT is in an active state, then processing 17 the test data and proceeding to next device to subject to testing;

If the DUT is in an inactive state, then validating 13 the test data with the previous test outcome signature;

Determining 14 whether the inactive DUT test data can be validated with the previous test outcome signature;

If the inactive DUT test data can be validated with the previous test outcome signature, then injecting 15 a reactivation signal to attempt to reactivate the DUT, and returning to the step of detecting 11, 12 whether a DUT is in an inactive state by functional measurement, thus allowing the DUT to continue its test run 10C without operator intervention; and If the inactive DUT test data cannot be validated with the previous test outcome signature, then processing 16 the test data as an invalid measurement, and proceeding 17 to the next device to subject to testing.

Figure 4C:
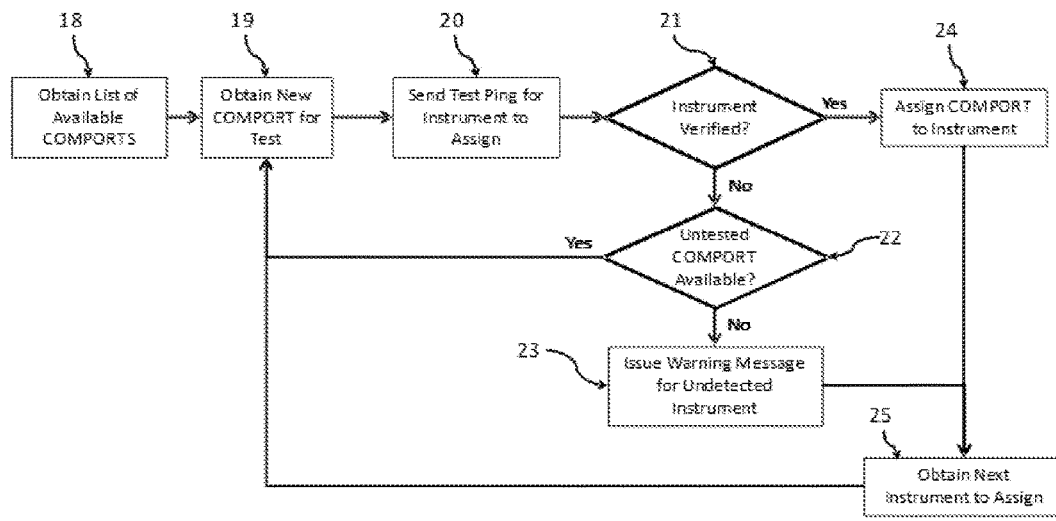
FIG. 4C depicts one embodiment of a control process for the CT System 1 to assign instrument addresses in the software execution to establish communication links for instrument control. The automated assignment process avoids the problems associated with manual assignments by human operators, who would have to have specific knowledge of the controller operating system, and often involves confusing and cumbersome trial-and-error experimentation. The improved system automatically assigns instrument addresses using a detection algorithm that determines the instrument type by evaluating ping-signal returns.
Figure 4D:
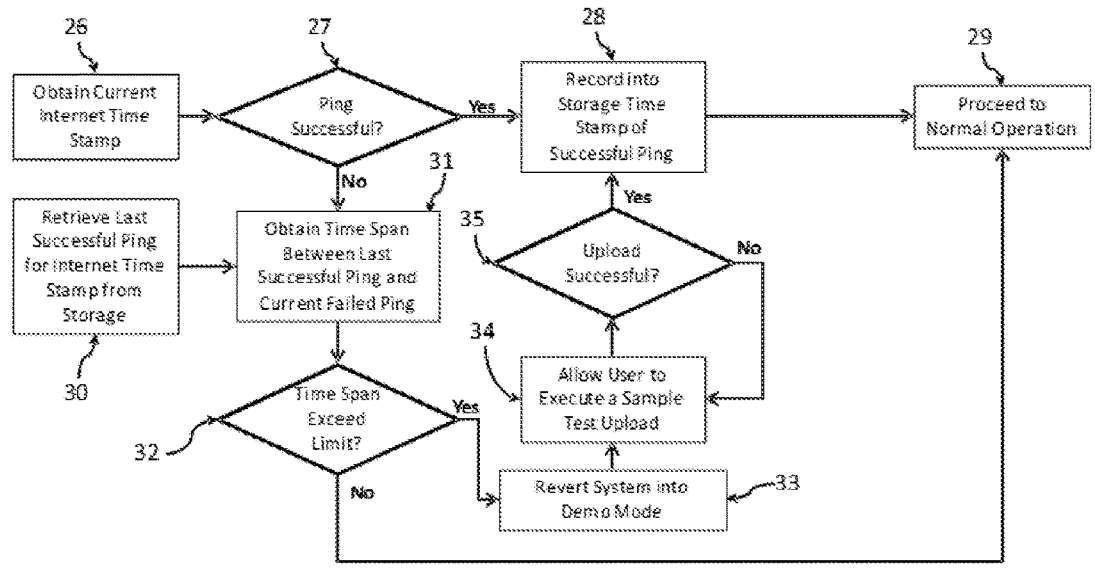
FIG. 4D depicts one embodiment of a control process for the CT System 1 to detect prolonged periods during which the CT System 1 has not had access to a stable Internet connection (the period is definable by a user/system administrator), In such an event, the CT System 1 will partially disable the testing system 1 until a stable Internet connection is established, and when said Internet connection is established, the system will automatically restore its configured functionality. This schema is designed to dissuade human users from disconnecting the improved system from the Internet with the intent to avoid testing-data upload.

During the deployment of some embodiments of the improved CT System 1, it is necessary to properly assign the instrument 2 addresses in the software program to establish communication links for instrument control. This assignment process, if done manually, requires specific knowledge of the controller-operating system and may often times involve confusing and cumbersome trial and error experimentation. To eliminate these issues, in some embodiments, the improved CT System 1 automatically assigns the instrument addresses by a detection ("ping") algorithm that determines the instrument type by evaluating ping signal returns, as depicted in FIG. 4C. The CT System 1 automatically assigns instrument addresses using a detection algorithm that determines the instrument type by evaluating ping-signal returns. In variations, the detection algorithm comprises the following steps:

Obtaining 18 a list of available COMPORTS 6A, 6B, 6C, 6D;

Selecting/obtaining 19 a COMPORT 6A, 6B, 6C, 6D for testing;

Sending 20 a test "ping" to ensure communication between the untested COMPORT 6A, 6B, 6C, 6D and the instrument 2 to assign;

Verifying 21 the instrument 2 has communication with the selected COMPORT 6A, 6B, 6C, 6D;

Assigning 24 the selected COMPORT 6A, 6B, 6C, 6D to the instrument 2;

If the instrument 2 does not have communication with the selected COMPORT 6A, 6B, 6C, 6D, then determining 22 whether the untested COMPORT is available;

If the untested COMPORT is available, then returning to the step of selecting/obtaining 19 a COMPORT 6A, 6B, 6C, 6D for testing;

If the untested COMPORT is not available, then issuing a warning message for the undetected instrument 2; and Obtaining 25 the next instrument 2 to assign to a COMPORT 6A, 6B, 6C, 6D and go back to the step of obtaining 18 a list of available COMPORTS 6A, 6B, 6C, 6D and repeat the aforementioned process.

In still more embodiments, the test data is automatically uploaded to an Internet-based server after every test run. The software program provides for environments with intermittent Internet connections by allowing for running uploads in background processes, simultaneously with a test session. The background uploads will run continuously until all data files have been successfully uploaded. In additional embodiments, the improved CT System 1 also detects prolonged periods where the improved CT System 1 has not had access to a stable Internet connection (period is definable by the administrator). In such an event, referring to FIG. 4D, the CT System's 1 software program will partially disable until a stable Internet connection is accessible, upon which the improved CT System 1 will automatically restore its configured functionality. This schema is designed to dissuade users from disconnecting the improved CT System 1 from the Internet with the intent to avoid data upload. In a variation, the algorithm used comprises the following steps:

Obtaining 26 a current Internet time stamp;

Determining 27 whether the ping was successful;

If the ping was successful, then recording into storage 28 the Internet time stamp and proceeding 29 to normal CT System 1 test operations;

If the ping was unsuccessful, then retrieving 30 the Internet time stamp from the last successful ping from Storage, then obtaining/determining 31 the time span between the last recorded successful ping and the current failed ping;

If the determined time span 31 exceeds a predetermined/preprogrammed limit, then reverting 33 the CT System 1 into Demo Mode; else, proceeding 29 to normal CT System 1 test operations;

If the CT System is in Demo Mode 33, then allowing the user to execute a sample test upload 34;

If the sample test upload 34 is unsuccessful, then repeating the step to execute a sample test upload 34 until a successful upload is achieved; and If the sample test upload 34 is successful, then recording into storage 28 the Internet time stamp and proceeding 29 to normal CT System 1 test operations.

Figure 4E:
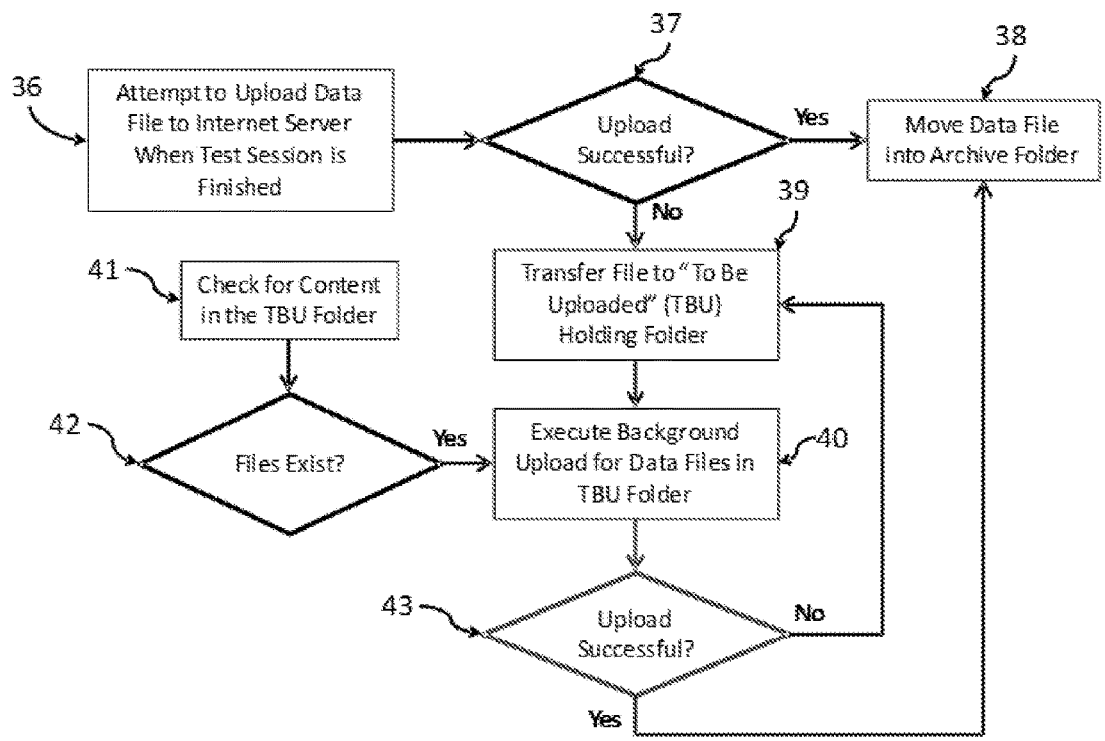
FIG. 4E depicts one embodiment of a control process for the CT System 1 to automatically store data files in the presence of an unstable Internet connection in the end-user environment (e.g., within China). The CT System 1 employs an auto-run process to store testing-data files that fail to upload due to said unstable Internet connectivity to a designated Internet server into a folder designated as queued records for subsequent uploading when connectivity is restored. The CT System 1 runs a parallel background process to attempt to completed the queued uploads until successfully completed.

Moreover, in even more embodiments, because of the anticipated unstable Internet connection in some end-user environments (such as in China), the CT System 1 software program employs an auto-run process to store data files that fails to upload to the Internet server into a "To be Uploaded" (TBU) folder, said stored data files designated as queued records for subsequent uploading when connectivity is restored. The CT System 1 runs a parallel background process to attempt to complete the queued uploads until successfully completed. The contents of the TBU folder will undergo constant upload attempts as a parallel-background process until a successful upload is achieved. In a variation, as depicted in FIG. 4E, this control process comprises the steps of:

Attempting to upload 36 a data file to an Internet server when a test session is completed;

Determining 37 whether the data-file upload was successful;

If the upload was successful, then moving 38 the data file into an archive folder;

If the upload was unsuccessful, then transferring 39 the data file to the "To Be Uploaded" (TBU) holding folder;

Checking 41 for content in the TBU holding folder, and if files exist 42, then executing a background upload 40 for the data files in the TBU holding folder;

Determining 42 whether the upload from the TBU holding folder was successful;

If the upload from the TBU holding folder was unsuccessful, then go back to the step for transferring 39 the data file to the "To Be Uploaded" (TBU) holding folder; and If the upload from the TBU holding folder was successful, then moving 38 the data file into an archive folder.

Figure 4F:
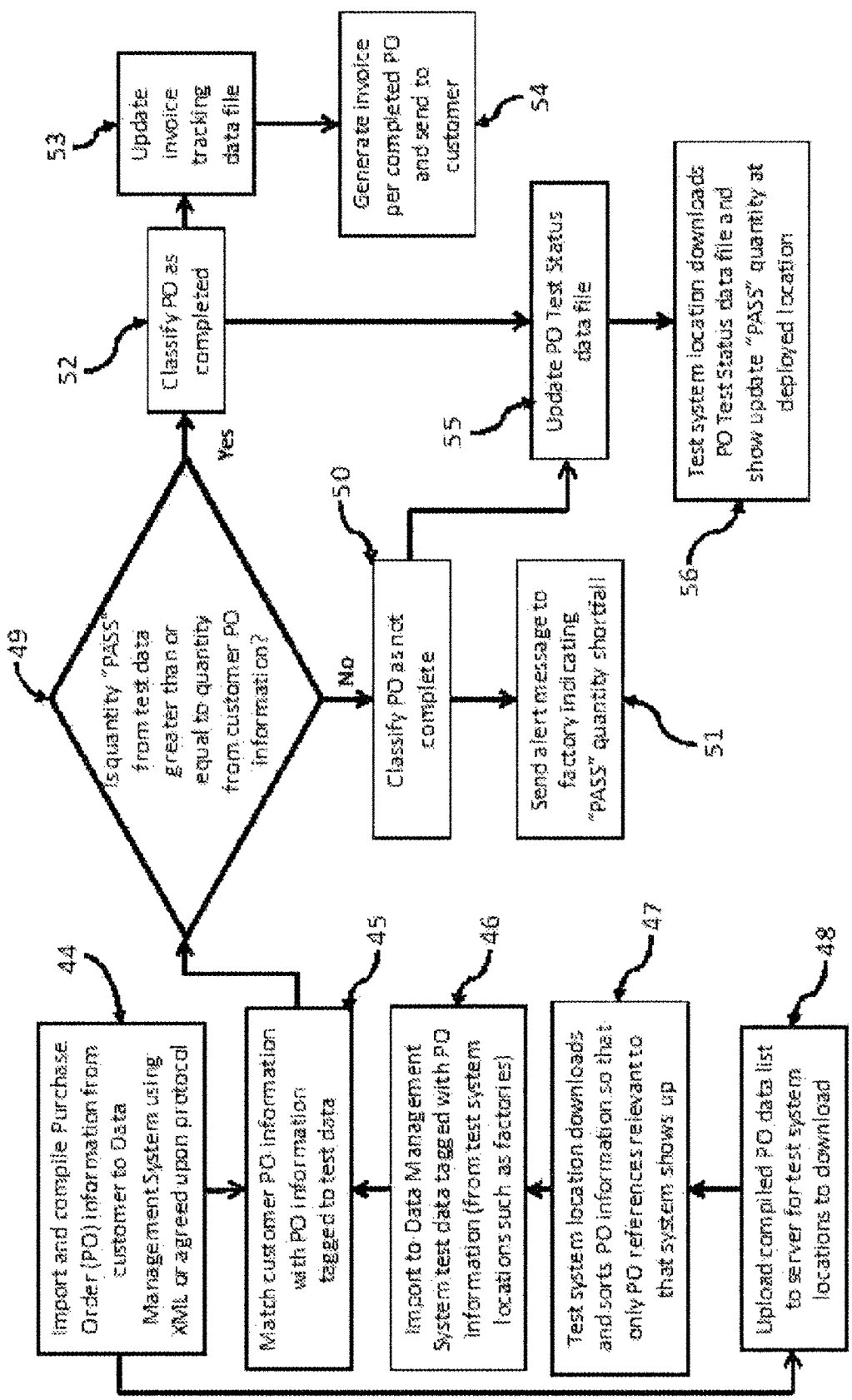
FIG. 4F depicts one embodiment of a control process for the CT System 1 to automatically link test data to purchase-order tracking and invoice generation using a data-management system.

In further variations of the CT System 1, as depicted in FIG. 4F, the control process for the CT System 1 is configured to automatically link test data to purchase-order tracking and invoice generation using a data-management system. In an embodiment, the control process comprises the steps of:

Either:
  Importing and compiling 44 purchase-order information from a customer to a designated data-management system using XML or other agreed-upon protocol; or
  Importing and compiling 44 purchase-order information from a customer to a designated data-management system using XML or other agreed-upon protocol, then:
    Uploading 48 compiled a purchase-order data list/information associated with test-system locations to download,
    Downloading and sorting 47 the purchase-order information so that only purchase-order references relevant to the targeted test system(s) is used, and
    Importing 46 to a designated data-management system the test data that is tagged with relevant purchase-order information using XML or other agreed-upon protocol;
Matching 45 customer purchase-order information with purchase-order information tagged to specific test data;
Determining 49 whether the quantity of "PASS" designations from the test data is greater than or equal to the quantity of ordered devices from the associated customer purchase-order information;
If the quantity of "PASS" designations from the test data is greater than or equal to the quantity of ordered devices from the associated customer purchase-order information, then:
  Classifying 52 the purchase order as "completed",
  Updating 53 the invoice-tracking file, and
  Generating 54 an invoice based on the completed purchase order, then sending to the customer;
If the quantity of "PASS" designations from the test data is not greater than or equal to the quantity of ordered devices from the associated customer purchase-order information, then:
  Classifying 50 the purchase order as "not completed", and
  Sending 51 a message alert to the originating factory indicating the shortfall;
Downloading 56 the purchase-order test-status data file; and
Showing 56 the updated "PASS" quantity at the CT System 1 deployed location.

Figure 4G:
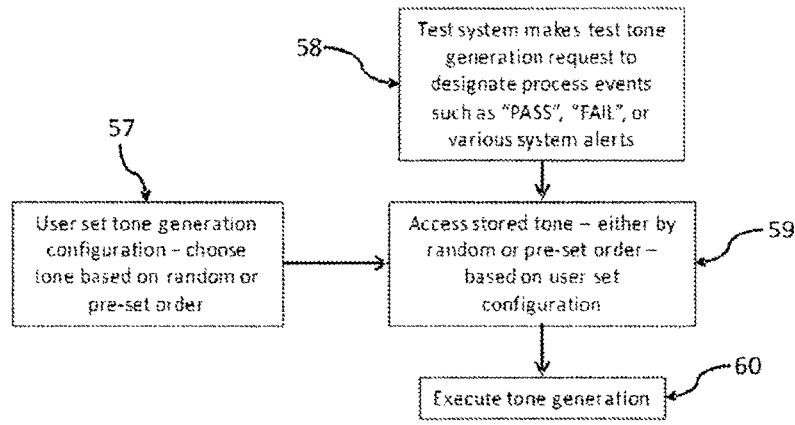
FIG. 4G depicts one embodiment of a control process for the CT System 1 to generate signal tones associated with various phases of the testing process of a portable power-bank device using the CT System 1.

In another variation of the CT System 1, as depicted in FIG. 4G, the control process for the CT System 1 is configured to generate signal tones associated with various phases of the testing process of a portable powerbank. In an embodiment, the control process comprises the steps of:
  By a user, setting 57 the tone-generation configuration based on either a random or preset order of tones;
  Making 58 a test-tone-generation request to designate process events such as "PASS", "FAIL", or various other system alerts;
  Accessing 59 a stored tone, either by random or pre-set order, based on the user-set configuration; and
  Executing 60 tone generation.

Figure 4H:
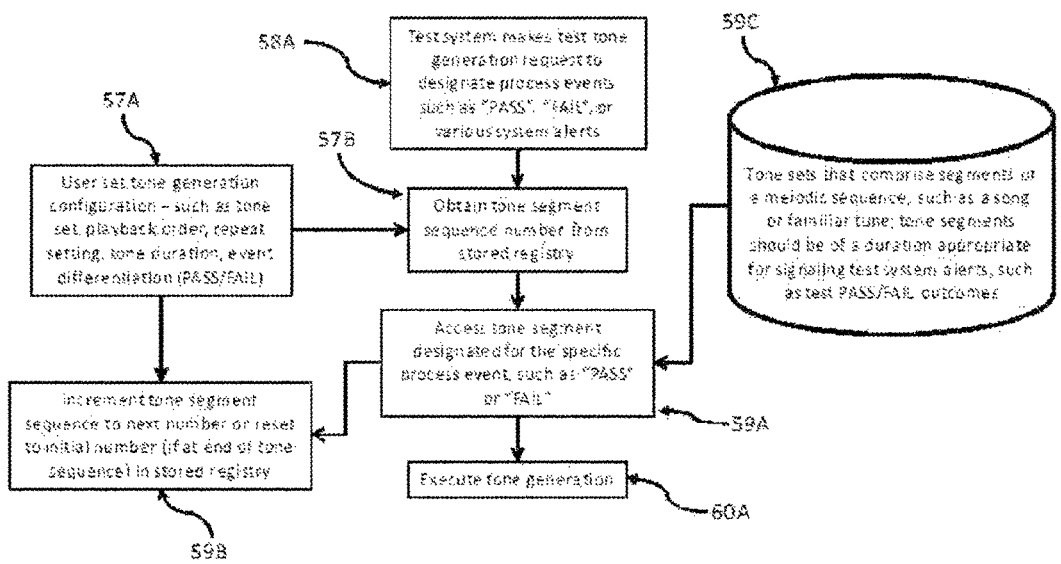
FIG. 4H depicts one embodiment of a variation of the control process depicted in FIG. 4G for the CT System 1 to generate signal tones associated with various phases of the testing process of a portable powerbank device using the CT System 1. In this variation, the signal-tone generation features melodically enhanced signaling by way of assembling a set of tone segments adapted from predetermined tune sequences, such as a familiar song, and is intended to minimize testing-system-operator mental fatigue by presenting progressive melodic signaling tone variations at each test cycle.

In a variant of the signal-tone generation capabilities of the CT System 1, as depicted in FIG. 4H, the control process for the CT System 1 is configured to generate melodically enhanced signal tones associated with various phases of the testing process of a portable powerbank. The melodically enhanced signaling-tone feature comprises of a set of tone segments adapted from tune sequences, such as a familiar song. Each tone segment should typically be of a duration appropriate for event signaling, such as PASS/FAIL in the CT System 1. The tone segments, when generated in order from multiple signaling events, will chain together the melodic sequence of the overall tune or familiar song, or merely a scale progression (e.g., "Do, Re, Mi, etc.). A break in the tonal sequence provides an audio clue to a CT System 1 operator that something within the testing process is amiss.

As an example, one suitable application for this feature would be in a factory-test environment that moves a very high volume of test units within relatively short amount of test time (in the order of seconds). Consider, for instance, a test flow that processes 500-800 units/hour. Hearing the same signaling tone (typically high-pitched beep or annoying buzz) at that rate for hours on end can easily saturate the CT System 1 operator's senses and drastically diminish the mental alertness needed to discern and process defects. A melodic signaling tone, with its progressive variation at each test cycle, can significantly reduce mental fatigue and atrophy. Moreover, if a tone sequence is familiar and enjoyed by the CT System 1 operator, it may offer a sense of anticipation and emotional continuity at each test cycle, such that, when broken with an "unanticipated" tone segment (e.g.—a "FAIL" event), will heighten the perceived difference between various events. Such scenarios can significantly enhance CT System 1 operator discernment, and ultimately production quality.

In an embodiment, the control process for generating melodically enhanced signal tones comprises the steps of:
  By a user, setting 57A the tone-generation configuration based on tone set, playback order, repeat setting, tone duration, and/or event differentiation (PASS/FAIL);
  Making 58A a test-tone-generation request to designate process events such as "PASS", "FAIL", or various other system alerts;
  Obtaining 57B a tone segment sequence number from the stored registry 59C;
  Accessing 59A a stored tone segment from storage 59C designated for the specific process event, such as "PASS" or "FAIL";
  Incrementing 59B the tone-segment sequence to the next number or, if at the end of a tone sequence, resetting to the initial tone-segment-sequence number; and
  Executing 60A melodic tone-sequence generation.

Figure 4I:
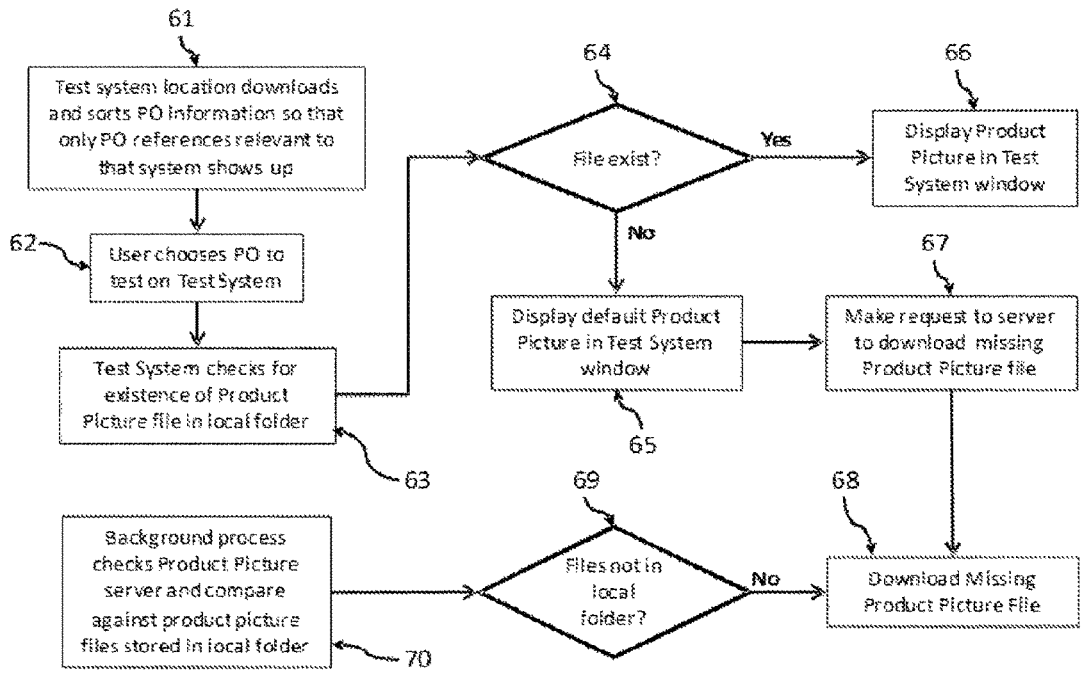
FIG. 4I depicts one embodiment of a control process for the CT System 1 to retrieve and generate a graphic-based product-verification display in the CT System 1 display window.

In more variations of the CT System 1, as depicted in FIG. 4I, the control process for the CT System 1 is configured to generate a graphical display of the product to be tested for visual verification by the user. In an embodiment, the control process comprises the steps of:
  Downloading and sorting 61 of purchase-order information so that only relevant purchase-order information is used;
  By a user, choosing a purchase order associated with a device to be tested on the CT System 1;
  Checking 63 for the existence of a product-picture file for the device under test (DUT) in a local folder;
  Determining 64 whether a DUT product-picture file exists;
    If the DUT product-picture file exists, then displaying 66 the DUT product-picture file in the CT System 1 window;
    If the DUT product-picture file does not exist, then:
      Displaying 65 a default product picture in the CT System 1 window,
      Making 67 a request to the server storing product pictures to download the missing DUT product-picture file, and
      Downloading 68 the missing DUT product-picture file; and In a CT System 1 background process, checking 70 the server storing product pictures and comparing 70 the remote-server-stored product-picture files against the product-picture files stored in the local folder, then:
    If any remote-server-stored product-picture files are not also stored in the local folder 69, then downloading 68 the missing DUT product-picture file.

Figure 4J:
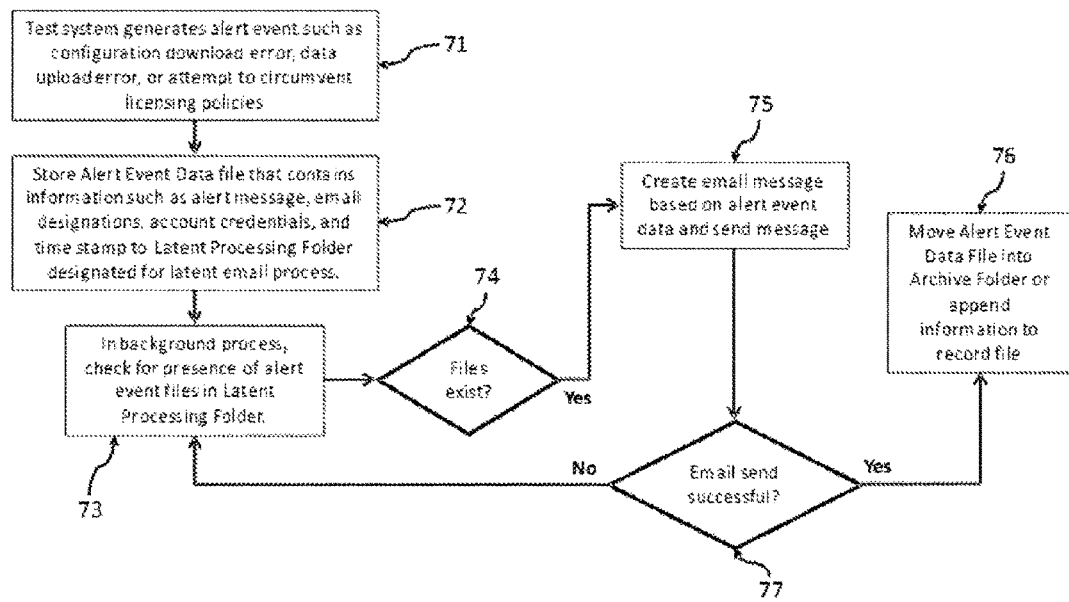
FIG. 4J depicts one embodiment of a control process for the CT System 1 to generate email-based alerts for abnormal events such as configuration-download errors, data-upload errors, or attempts to circumvent licensing policies/testing protocols.

In additional variations of the CT System 1, as depicted in FIG. 4J, the control process for the CT System 1 to generate email-based alerts for latent and/or abnormal events such as configuration-download errors, data-upload errors, or attempts to circumvent licensing policies/testing protocols. In an embodiment, the control process comprises the steps of:
- Generating 71 a CT System 1 alert event such as a configuration-download error, a data-upload error, or an attempt to circumvent licensing policies;
- Storing 72 alert-event data that contains information such as the alert message, email designators/recipients, account credentials, and a time stamp to a Latent-Processing Folder designated for latent email processing;
- As part of a CT System 1 background process, checking 73 for the presence of alert-event files in the Latent-Processing Folder;
- Determining 74 whether any alert-event files exist for further processing;
- Creating 75 an email message based on stored alert-event data and sending 75 the email message to designated recipients;
- Determining 77 whether the alert-event email sending was successful;
- If the alert-event email sending was successful, then moving 76 the alert-event data file into an Archive Folder or appending the alert-event data file to a pre-designated record file; and
- If the alert-event email sending was unsuccessful, then returning to the step for checking 73 for the presence of alert-event files in the Latent-Processing Folder.

Those ordinarily skilled in the art will recognize that different embodiments of the CT System 1 may employ all or only portions of the above-described specialized control processes based on the embedded software within the CT System 1. Moreover, those ordinarily skilled in the art will recognize that the descriptions provided above for the CT System 1 inherently also describe various methods of use and making of the system, all of which disclosures are intended to be included in the inventive disclosures herein.

IV. Alternative Embodiments and Other Variations

The various embodiments and variations thereof described herein, including the descriptions in any appended claims and/or illustrated in the accompanying Figures, are merely exemplary and are not meant to limit the scope of the inventive disclosure. It should be appreciated that numerous variations of the invention have been contemplated as would be obvious to one of ordinary skill in the art with the benefit of this disclosure.

Hence, those ordinarily skilled in the art will have no difficulty devising myriad obvious variations and improvements to the invention, all of which are intended to be encompassed within the scope of the Description, Figures, and Claims herein.

What is claimed is:

1. An improved testing system for portable charging devices to facilitate fault detection and isolation, comprising:
  at least one measuring instrument;
  a power supply;
  an artificial test load;
  at least two USB ports, each adapted to receive a USB cable connection to a portable charging device to be tested;
  at least one connection relay adapted to be able to connect said at least two USB ports to said power supply and said artificial test load;
  at least one computing device in communication with said at least one measuring instrument, said artificial test load, said power supply, and said at least one connection relay, said at least one computing device having local data-storage capabilities, a graphical display, a user-input means, and at least one communications means to at least one remotely located server; and
  an embedded software program for managing control processes, which, when executed, comprises the following steps:
    configuring user rights for accessing test reports,
    configuring available test functionalities and their time stamp in the system environment,
    retrieving specific data files resident in said local data storage that have not been successfully uploaded to an Internet-based server,
    sending custom messages that appear when said software program is launched,
    after running a device quality-control test, detecting whether the tested device is in an inactive state by functional measurement,
    if said tested device is in an active state, then processing the test data and proceeding to next device to subject to testing,
    if the tested device is in an inactive state, then validating the test data with the previous test outcome signature,
    determining whether the inactive tested device test data can be validated with the previous test outcome signature,
    if the inactive tested device test data can be validated with the previous test outcome signature, then injecting a reactivation signal to attempt to reactivate the tested device, and returning to the step of detecting whether a tested device is in an inactive state by functional measurement, and
    if the inactive tested device test data cannot be validated with the previous test outcome signature, then processing the test data as an invalid measurement, and proceeding to the next device to subject to testing;
  wherein:
    said improved testing system is adapted to support the simultaneous or alternating testing of two charging devices in order to minimize the idle down time between testing of additional charging devices;
    said at least one connection relay is comprised of two four-channel relays;
    the first four-channel relay is configured to be in electrical communication with said artificial test load via the positive bus;
    the second four-channel relay is configured to be in electrical communication with said artificial test load via the ground bus; and said embedded software program, when executed, allows for the user to initiate the testing process from a first USB port, while suspending the testing process of the next USB port until the previous testing process is finished and the next USB port testing process is set up.

2. The improved testing system for portable charging devices of claim 1, wherein said at least two USB ports are further comprised of:
two standard USB ports; and
two micro USB ports.

3. The improved testing system for portable charging devices of claim 1 or 2, wherein said at least one measuring instrument is configured to monitor the differential-data signals at the D+ and D− USB pins in said at least two standard USB ports.

4. The improved testing system for portable charging devices of claim 1 or 2, wherein said at least one measuring instrument is adapted to allow for an independent connection to another extra-system measuring instrument using a test cable that splices off the D+ and D− signals from one of said USB ports.

5. The improved testing system for portable charging devices of claim 1, wherein uploading of data files to an Internet-based server uses encryption.

6. The improved testing system for portable charging devices of claim 1, wherein said embedded software program, when executed, allows for user-configurable time delays for user-specified portable-charger functional testing measurements.

7. The improved testing system for portable charging devices of claim 1, wherein said embedded software program, when executed, automatically assigns an available USB port address to said at least one measuring instrument, while also determining measuring-instrument type, in order to establish communication links for measuring instrument control.

8. The improved testing system for portable charging devices of claim 7, wherein said automatic assignment of USB port addresses to said at least one measuring instrument comprises the following steps:
obtaining a list of available USB ports;
obtaining a USB port for testing;
sending a test "ping" to ensure communication between the untested USB port and the measuring instrument to assign;
verifying that the instrument has communication with the selected USB port;
assigning the selected USB port to the measuring instrument;
if the measuring instrument does not have communication with the selected USB port, then determining whether the untested USB port is available;
if the untested USB port is available, then returning to the step of obtaining a USB port for testing;
if the untested USB port is not available, then issuing a warning message for the undetected measuring instrument; and
obtaining the next measuring instrument to assign to a USB port and go back to the step of obtaining a list of available USB ports and repeat the aforementioned process.

9. The improved testing system for portable charging devices of claim 1, wherein said embedded software program, when executed, automatically uploads test data to an Internet-based server after every test run, and provides for environments with intermittent or unstable Internet connections by partially disabling such uploads and storing in said local data storage, allowing for running uploads in background processes simultaneously with a testing process when an Internet connection is restored.

10. The improved testing system for portable charging devices of claim 9, wherein said embedded software program, when executed, automatically uploads test data to an Internet-based server after every test run and detects unstable or inactive Internet connectivity, and comprises the following steps:
obtaining a current Internet time stamp by pinging the connection;
determining whether the ping was successful;
if the ping was successful, then recording into said storage the Internet time stamp and proceeding to normal testing operations;
if the ping was unsuccessful, then retrieving the Internet time stamp from the last successful ping from said storage, then determining the time span between the last recorded successful ping and the current failed ping;
if the determined time span exceeds a predetermined/preprogrammed limit, then reverting the improved testing system into Demo Mode; else, proceeding to normal testing operations;
if the improved testing system is in Demo Mode, then allowing the user to execute a sample test upload;
if the sample test upload is unsuccessful, then repeating the step to execute a sample test upload until a successful upload is achieved; and
if the sample test upload is successful, then recording into said storage the Internet time stamp and proceeding to normal testing operations.

11. The improved testing system for portable charging devices of claim 1, wherein said embedded software program, when executed:
employs an auto-run process to store data files that fails to upload to the Internet server into a "To be Uploaded" (TBU) folder in said local data storage, said stored data files designated as queued records for subsequent uploading when connectivity is restored; and
runs a parallel background process to attempt to complete said queued data uploads until successfully completed, with the contents of the TBU folder subjected to continuous upload attempts in said parallel-background process until a successful upload of all queued data files is achieved.

12. The improved testing system for portable charging devices of claim 11, wherein said embedded software program, when executed, comprises the following steps:
attempting to upload a data file to an Internet server when a test session is completed;
determining whether the data-file upload was successful;
if the upload was successful, then moving the data file into an archive folder;
if the upload was unsuccessful, then transferring the data file to the "To Be Uploaded" (TBU) holding folder;
checking for content in the TBU holding folder, and if files exist, then executing a background upload for the data files in the TBU holding folder;
determining whether the upload from the TBU holding folder was successful;
if the upload from the TBU holding folder was unsuccessful, then go back to the step for transferring the data file to the "To Be Uploaded" (TBU) holding folder; and
if the upload from the TBU holding folder was successful, then moving the data file into an archive folder.

13. The improved testing system for portable charging devices of claim 1, wherein said embedded software program, when executed, automatically links test data to purchase-order tracking and invoice generation using a data-management system.

14. The improved testing system for portable charging devices of claim 13, wherein said embedded software program, when executed, comprises the following steps:
   importing and compiling purchase-order information from a customer to a designated data-management system using XML or other agreed-upon protocol;
   as necessary, uploading compiled a purchase-order data list/information associated with test-system locations to download;
   as necessary, downloading and sorting the purchase-order information so that only purchase-order references relevant to the targeted test system(s) is used;
   as necessary, importing to a designated data-management system the test data that is tagged with relevant purchase-order information using XML or other agreed-upon protocol;
   matching customer purchase-order information with purchase-order information tagged to specific test data;
   determining whether the quantity of "PASS" designations from the test data is greater than or equal to the quantity of ordered devices from the associated customer purchase-order information;
   if the quantity of "PASS" designations from the test data is greater than or equal to the quantity of ordered devices from the associated customer purchase-order information, then classifying the purchase order as "completed", updating the invoice-tracking file, and generating an invoice based on the completed purchase order, then sending to the customer;
   if the quantity of "PASS" designations from the test data is not greater than or equal to the quantity of ordered devices from the associated customer purchase-order information, then classifying the purchase order as "not completed", and sending a message alert to the originating factory indicating the shortfall;
   downloading the purchase-order test-status data file; and
   displaying the updated "PASS" quantity.

15. The improved testing system for portable charging devices of claim 1, wherein said embedded software program, when executed, generates signal tones associated with various phases of the testing process of a portable charging device.

16. The improved testing system for portable charging devices of claim 15, wherein said embedded software program, when executed, comprises the following steps:
   by a user, setting the tone-generation configuration based on either a random or preset order of tones;
   making a test-tone-generation request to designate process events such as "PASS", "FAIL", or various other system alerts;
   accessing a stored tone, either by random or pre-set order, based on the user-set configuration; and
   executing tone generation.

17. The improved testing system for portable charging devices of claim 15, wherein said embedded software program, when executed, generates melodically enhanced signal tones associated with various phases of the testing process of a portable charging device.

18. The improved testing system for portable charging devices of claim 17, wherein said embedded software program, when executed, comprises the following steps:
   by a user, setting the tone-generation configuration based on tone set, playback order, repeat setting, tone duration, and/or event differentiation;
   making a test-tone-generation request to designate process events such as "PASS", "FAIL", or various other system alerts;
   obtaining a tone segment sequence number from a stored registry;
   accessing a stored tone segment from said storage designated for the specific process event;
   incrementing the tone-segment sequence to the next number or, if at the end of a tone sequence, resetting to the initial tone-segment-sequence number; and
   executing melodic tone-sequence generation.

19. The improved testing system for portable charging devices of claim 1, wherein said embedded software program, when executed, generates a graphical display of the product to be tested for visual verification by the user.

20. The improved testing system for portable charging devices of claim 19, wherein said embedded software program, when executed, comprises the following steps:
   downloading and sorting purchase-order information so that only relevant purchase-order information is used;
   by a user, choosing a purchase order associated with a device under test;
   checking for the existence of a product-picture file for said device under test in said local storage folder;
   determining whether a product-picture file exists for said device under test;
   if product-picture file exists for said device under test, then displaying the product-picture file for the device under test;
   if the product-picture file for the device under test does not exist, then displaying a default product picture, making a request to the server storing product pictures to download the missing product-picture file for the device under test, and downloading the missing product-picture file for the product under test; and
   in a background process, checking the server storing product pictures and comparing the remote-server-stored product-picture files against the product-picture files stored in the local folder, then if any remote-server-stored product-picture files are not also stored in said local storage folder, then downloading the missing product-picture file for the device under test.

21. The improved testing system for portable charging devices of claim 1, wherein said embedded software program, when executed, generates email-based alerts for latent and/or abnormal events.

22. The improved testing system for portable charging devices of claim 21, wherein said embedded software program, when executed, comprises the following steps:
   generating an alert event;
   storing alert-event data that contains information including the alert message, email designators/recipients, account credentials, and a time stamp to a Latent-Processing Folder designated for latent email processing;
   as part of a background process, checking for the presence of alert-event files in the Latent-Processing Folder;
   determining whether any alert-event files exist for further processing;
   creating an email message based on stored alert-event data and sending the email message to designated recipients;

if the alert-event email sending was successful, then moving the alert-event data file into an Archive Folder or appending the alert-event data file to a pre-designated record file; and if the alert-event email sending was unsuccessful, then returning to the step for checking for the presence of alert-event files in the Latent-Processing Folder.

23. The improved testing system for portable charging devices of claim 21, wherein said alert events are selected from the group consisting of a configuration-download error, a data-upload error, and an attempt to circumvent licensing policies.

24. The improved testing system for portable charging devices of claim 22, wherein said alert events are selected from the group consisting of a configuration-download error, a data-upload error, and an attempt to circumvent licensing policies.

25. A method of using an improved testing system for portable charging devices to facilitate fault detection and isolation, the method comprising the steps of:
   obtaining an improved testing system for portable charging devices, comprising:
      at least one measuring instrument,
      a power supply,
      an artificial test load,
      at least two USB ports, each adapted to receive a USB cable connection to a portable charging device to be tested,
      at least one connection relay adapted to be able to connect said at least two USB ports to said power supply and said artificial test load,
      at least one computing device in communication with said at least one measuring instrument, said artificial test load, said power supply, and said at least one connection relay, said at least one computing device having local data-storage capabilities, a graphical display, a user-input means, and at least one communications means to at least one remotely located server, and
      an embedded software program for managing control processes, which, when executed, comprises the following steps:
         configuring user rights for accessing test reports,
         configuring available test functionalities and their time stamp in the system environment,
         retrieving specific data files resident in said local data storage that have not been successfully uploaded to an Internet-based server,
         sending custom messages that appear when said software program is launched,
         after running a device quality-control test, detecting whether the tested device is in an inactive state by functional measurement,
         if said tested device is in an active state, then processing the test data and proceeding to next device to subject to testing,
         if the tested device is in an inactive state, then validating the test data with the previous test outcome signature,
         determining whether the inactive tested device test data can be validated with the previous test outcome signature,
         if the inactive tested device test data can be validated with the previous test outcome signature, then injecting a reactivation signal to attempt to reactivate the tested device, and returning to the step of detecting whether a tested device is in an inactive state by functional measurement, and
         if the inactive tested device test data cannot be validated with the previous test outcome signature, then processing the test data as an invalid measurement, and proceeding to the next device to subject to testing;
      wherein:
         said improved testing system is adapted to support the simultaneous or alternating testing of two charging devices in order to minimize the idle down time between testing of additional charging devices,
         said at least one connection relay is comprised of two four-channel relays the first four-channel relay is configured to be in electrical communication with said artificial test load via the positive bus,
         the second four-channel relay is configured to be in electrical communication with said artificial test load via the ground bus, and
         said embedded software program, when executed, allows for the user to initiate the testing process from a first USB port, while suspending the testing process of the next USB port until the previous testing process is finished and the next USB port testing process is set up;
   connecting a first portable charging device to said system via a first of said at least two USB ports;
   connecting a second portable charging device to said system via a second of said at least two USB ports;
   energizing said system;
   running quality-control functionality tests on said first portable charging device; and
   running quality-control functionality tests on said second portable charging device.

26. The method of claim 25, wherein said at least two USB ports are further comprised of:
   two standard USB ports; and
   two micro USB ports.

27. The method of claim 26, wherein said at least one measuring instrument is configured to monitor the differential-data signals at the D+ and D− USB pins in said at least two standard USB ports.

28. The method of claim 26, wherein said at least one measuring instrument is adapted to allow for an independent connection to another extra-system measuring instrument using a test cable that splices off the D+ and D− signals from one of said USB ports.

29. The method of claim 25, wherein uploading of data files to an Internet-based server uses encryption.

30. The method of claim 25, wherein said embedded software program, when executed, allows for user-configurable time delays for user-specified portable-charger functional testing measurements.

31. The method of claim 25, wherein said embedded software program, when executed, automatically assigns an available USB port address to said at least one measuring instrument, while also determining measuring-instrument type, in order to establish communication links for measuring instrument control.

32. The method of claim 31, wherein said automatic assignment of USB port addresses to said at least one measuring instrument comprises the following steps:
   obtaining a list of available USB ports;
   obtaining a USB port for testing;

sending a test "ping" to ensure communication between the untested USB port and the measuring instrument to assign;

verifying that the instrument has communication with the selected USB port;

assigning the selected USB port to the measuring instrument;

if the measuring instrument does not have communication with the selected USB port, then determining whether the untested USB port is available;

if the untested USB port is available, then returning to the step of obtaining a USB port for testing;

if the untested USB port is not available, then issuing a warning message for the undetected measuring instrument; and obtaining the next measuring instrument to assign to a USB port and go back to the step of obtaining a list of available USB ports and repeat the aforementioned process.

33. The method of claim 25, wherein said embedded software program, when executed, automatically uploads test data to an Internet-based server after every test run, and provides for environments with intermittent or unstable Internet connections by partially disabling such uploads and storing in said local data storage, allowing for running uploads in background processes simultaneously with a testing process when an Internet connection is restored.

34. The method of claim 33, wherein said embedded software program, when executed, automatically uploads test data to an Internet-based server after every test run and detects unstable or inactive Internet connectivity, and comprises the following steps:

obtaining a current Internet time stamp by pinging the connection;

determining whether the ping was successful;

if the ping was successful, then recording into said storage the Internet time stamp and proceeding to normal testing operations;

if the ping was unsuccessful, then retrieving the Internet time stamp from the last successful ping from said storage, then determining the time span between the last recorded successful ping and the current failed ping;

if the determined time span exceeds a predetermined/preprogrammed limit, then reverting the improved testing system into Demo Mode; else, proceeding to normal testing operations;

if the improved testing system is in Demo Mode, then allowing the user to execute a sample test upload;

if the sample test upload is unsuccessful, then repeating the step to execute a sample test upload until a successful upload is achieved; and if the sample test upload is successful, then recording into said storage the Internet time stamp and proceeding to normal testing operations.

35. The method of claim 25, wherein said embedded software program, when executed:

employs an auto-run process to store data files that fails to upload to the Internet server into a "To be Uploaded" (TBU) folder in said local data storage, said stored data files designated as queued records for subsequent uploading when connectivity is restored; and runs a parallel background process to attempt to complete said queued data uploads until successfully completed, with the contents of the TBU folder subjected to continuous upload attempts in said parallel-background process until a successful upload of all queued data files is achieved.

36. The method of claim 35, wherein said embedded software program, when executed, comprises the following steps:

attempting to upload a data file to an Internet server when a test session is completed;

determining whether the data-file upload was successful;

if the upload was successful, then moving the data file into an archive folder;

if the upload was unsuccessful, then transferring the data file to the "To Be Uploaded" (TBU) holding folder;

checking for content in the TBU holding folder, and if files exist, then executing a background upload for the data files in the TBU holding folder;

determining whether the upload from the TBU holding folder was successful;

if the upload from the TBU holding folder was unsuccessful, then go back to the step for transferring the data file to the "To Be Uploaded" (TBU) holding folder; and if the upload from the TBU holding folder was successful, then moving the data file into an archive folder.

37. The method of claim 25, wherein said embedded software program, when executed, automatically links test data to purchase-order tracking and invoice generation using a data-management system.

38. The method of claim 37, wherein said embedded software program, when executed, comprises the following steps:

importing and compiling purchase-order information from a customer to a designated data-management system using XML or other agreed-upon protocol;

as necessary, uploading compiled a purchase-order data list/information associated with test-system locations to download;

as necessary, downloading and sorting the purchase-order information so that only purchase-order references relevant to the targeted test system(s) is used;

as necessary, importing to a designated data-management system the test data that is tagged with relevant purchase-order information using XML or other agreed-upon protocol;

matching customer purchase-order information with purchase-order information tagged to specific test data;

determining whether the quantity of "PASS" designations from the test data is greater than or equal to the quantity of ordered devices from the associated customer purchase-order information;

if the quantity of "PASS" designations from the test data is greater than or equal to the quantity of ordered devices from the associated customer purchase-order information, then classifying the purchase order as "completed", updating the invoice-tracking file, and generating an invoice based on the completed purchase order, then sending to the customer;

if the quantity of "PASS" designations from the test data is not greater than or equal to the quantity of ordered devices from the associated customer purchase-order information, then classifying the purchase order as "not completed", and sending a message alert to the originating factory indicating the shortfall;

downloading the purchase-order test-status data file; and displaying the updated "PASS" quantity.

39. The method of claim 25, wherein said embedded software program, when executed, generates signal tones associated with various phases of the testing process of a portable charging device.

40. The method of claim 39, wherein said embedded software program, when executed, comprises the following steps:
- by a user, setting the tone-generation configuration based on either a random or preset order of tones;
- making a test-tone-generation request to designate process events such as "PASS", "FAIL", or various other system alerts;
- accessing a stored tone, either by random or pre-set order, based on the user-set configuration; and
- executing tone generation.

41. The method of claim 39, wherein said embedded software program, when executed, generates melodically enhanced signal tones associated with various phases of the testing process of a portable charging device.

42. The method of claim 41, wherein said embedded software program, when executed, comprises the following steps:
- by a user, setting the tone-generation configuration based on tone set, playback order, repeat setting, tone duration, and/or event differentiation;
- making a test-tone-generation request to designate process events such as "PASS", "FAIL", or various other system alerts;
- obtaining a tone segment sequence number from a stored registry;
- accessing a stored tone segment from said storage designated for the specific process event;
- incrementing the tone-segment sequence to the next number or, if at the end of a tone sequence, resetting to the initial tone-segment-sequence number; and
- executing melodic tone-sequence generation.

43. The method of claim 25, wherein said embedded software program, when executed, generates a graphical display of the product to be tested for visual verification by the user.

44. The method of claim 43, wherein said embedded software program, when executed, comprises the following steps:
- downloading and sorting purchase-order information so that only relevant purchase-order information is used;
- by a user, choosing a purchase order associated with a device under test;
- checking for the existence of a product-picture file for said device under test in said local storage folder;
- determining whether a product-picture file exists for said device under test;
- if product-picture file exists for said device under test, then displaying the product-picture file for the device under test;
- if the product-picture file for the device under test does not exist, then displaying a default product picture, making a request to the server storing product pictures to download the missing product-picture file for the device under test, and downloading the missing product-picture file for the product under test; and
- in a background process, checking the server storing product pictures and comparing the remote-server-stored product-picture files against the product-picture files stored in the local folder, then if any remote-server-stored product-picture files are not also stored in said local storage folder, then downloading the missing product-picture file for the device under test.

45. The method of claim 25, wherein said embedded software program, when executed, generates email-based alerts for latent and/or abnormal events.

46. The method of claim 45, wherein said embedded software program, when executed, comprises the following steps:
- generating an alert event;
- storing alert-event data that contains information including the alert message, email designators/recipients, account credentials, and a time stamp to a Latent-Processing Folder designated for latent email processing;
- as part of a background process, checking for the presence of alert-event files in the Latent-Processing Folder;
- determining whether any alert-event files exist for further processing;
- creating an email message based on stored alert-event data and sending the email message to designated recipients;
- if the alert-event email sending was successful, then moving the alert-event data file into an Archive Folder or appending the alert-event data file to a pre-designated record file; and
- if the alert-event email sending was unsuccessful, then returning to the step for checking for the presence of alert-event files in the Latent-Processing Folder.

47. The method of claim 45, wherein said alert events are selected from the group consisting of a configuration-download error, a data-upload error, and an attempt to circumvent licensing policies.

48. The method of claim 46, wherein said alert events are selected from the group consisting of a configuration-download error, a data-upload error, and an attempt to circumvent licensing policies.

* * * * *